(12) United States Patent
Cho et al.

(10) Patent No.: US 9,202,596 B2
(45) Date of Patent: Dec. 1, 2015

(54) SEMICONDUCTOR DEVICE, SEMICONDUCTOR REPAIR SYSTEM INCLUDING THE SAME, AND METHOD FOR OPERATING THE SEMICONDUCTOR DEVICE

(71) Applicant: SK hynix Inc., Gyeonggi-do (KR)

(72) Inventors: Seon-Ki Cho, Gyeonggi-do (KR); Yong-Ho Kong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/555,416

(22) Filed: Nov. 26, 2014

(65) Prior Publication Data
US 2015/0310939 A1    Oct. 29, 2015

(30) Foreign Application Priority Data

Apr. 25, 2014 (KR) ........................ 10-2014-0049852

(51) Int. Cl.
*G11C 29/00* (2006.01)
*G11C 17/16* (2006.01)
*G11C 17/18* (2006.01)

(52) U.S. Cl.
CPC ............... *G11C 29/76* (2013.01); *G11C 17/16* (2013.01); *G11C 17/18* (2013.01); *G11C 29/78* (2013.01); *G11C 29/835* (2013.01)

(58) Field of Classification Search
CPC ...... G11C 29/76; G11C 29/78; G11C 29/835; G11C 17/16; G11C 17/18
See application file for complete search history.

(56) References Cited

U.S. PATENT DOCUMENTS

| 5,596,538 A * | 1/1997 | Joo ........................ G11C 29/44 365/194 |
| 9,036,441 B2 * | 5/2015 | Oh ........................ G11C 17/16 365/104 |
| 2007/0103999 A1 * | 5/2007 | Kodama ................. G11C 29/02 365/200 |
| 2013/0322149 A1 * | 12/2013 | Ryu ..................... G11C 7/1045 365/96 |
| 2014/0347909 A1 * | 11/2014 | Chi ........................ G11C 17/18 365/96 |

FOREIGN PATENT DOCUMENTS

KR    1020090121295    11/2009

* cited by examiner

*Primary Examiner* — Vanthu Nguyen
(74) *Attorney, Agent, or Firm* — IP & T Group LLP

(57) ABSTRACT

A semiconductor device includes: a plurality of fuse arrays each including a plurality of fuses; a selection block which selects one fuse array among the fuse arrays in response to values of a group of bits of a repair code; a code alignment block which aligns disposition of bits other than the group of bits of the repair code, wherein the alignment disposition is changed based on the fuse array selected in the selection block; and an operation block which controls an operation of the fuse array selected in the selection block in response to a repair command and an output code of the code alignment block.

20 Claims, 10 Drawing Sheets

FIG. 2

| | | X | Y Up | Y Dn | TM |
|---|---|---|---|---|---|
| DQ0 | 0 | 0 | 0 | 1 | 1 |
| | 1 | 0 | 1 | 0 | 1 |
| | 2 | T1 | T1 | T1 | T1 |
| | 3 | | A3 | A3 | |
| | 4 | | A4 | A4 | |
| | 5 | A5 | A5 | A5 | A5 |
| | 6 | A6 | | | A6 |
| | 7 | T2 | T2 | T2 | T2 |
| DQ1 | 10 | A10 | A10 | A10 | A10 |
| | 11 | A11 | A11 | A11 | A11 |
| | 12 | A12 | A12 | A12 | A12 |
| | 13 | A13 | A13 | A13 | A13 |
| | 14 | A14 | A14 | A14 | A14 |
| | 15 | A15 | A15 | A15 | A15 |
| | 16 | A16 | A16 | A16 | A16 |
| | 17 | A17 | A17 | A17 | A17 |
| DQ2 | 20 | D12 | | | D12 |
| | 21 | D11 | | | D11 |
| | 22 | D10 | | | D10 |
| | 23 | D9 | | | D9 |
| | 24 | D8 | | | D8 |
| | 25 | D7 | D7 | D7 | D7 |
| | 26 | D6 | D6 | D6 | D6 |
| | 27 | D5 | D5 | D5 | D5 |
| DQ3 | 30 | D4 | D4 | D4 | D4 |
| | 31 | D3 | D3 | D3 | D3 |
| | 32 | D2 | D2 | D2 | D2 |
| | 33 | D1 | D1 | D1 | D1 |
| | 34 | D0 | D0 | D0 | D0 |
| | 35 | | | | |
| | 36 | | | | |
| | 37 | E | E | E | E |

| ADDCD<11:0> | 11 | A3 |
|---|---|---|
| | 10 | A4 |
| | 9 | A5 |
| | 8 | A6 |
| | 7 | T2 |
| | 7 | A10 |
| | 6 | A11 |
| | 5 | A12 |
| | 4 | A13 |
| | 3 | A14 |
| | 2 | A15 |
| | 1 | A16 |
| | 0 | A17 |
| DATACD<12:0> | 12 | D12 |
| | 11 | D11 |
| | 10 | D10 |
| | 9 | D9 |
| | 8 | D8 |
| | 7 | D7 |
| | 6 | D6 |
| | 5 | D5 |
| | 4 | D4 |
| | 3 | D3 |
| | 2 | D2 |
| | 1 | D1 |
| | 0 | D0 |

FIG. 4

SEMICONDUCTOR DEVICE, SEMICONDUCTOR REPAIR SYSTEM INCLUDING THE SAME, AND METHOD FOR OPERATING THE SEMICONDUCTOR DEVICE

CROSS-REFERENCE TO RELATED APPLICATIONS

The present application claims priority of Korean Patent Application No. 10-2014-0049852, filed on Apr. 25, 2014, which is incorporated herein by reference in its entirety.

BACKGROUND

1. Field

Various exemplary embodiments of the present invention relate to a semiconductor design technology, and more particularly, to a semiconductor device including a fuse array.

2. Description of the Related Art

A large number of fuse options are used in semiconductor devices. For an example of a fuse option included in a semiconductor memory device, when a fuse included in the fuse option is cut, a redundancy memory cell is selected instead of a failed normal memory cell.

In general, the fuse included in the fuse option is cut by using a laser or a powerful current or voltage. In other words, the fuse included in the fuse option is cut to replace a failed normal memory cell with a redundancy memory cell.

As the amount of data to be repaired increases, circuits for performing rupture and read operations on each fuse occupy more space in the semiconductor device.

Therefore, recently, an array of fuses has been used in which the rupture and read operations are performed based on cell addresses.

SUMMARY

Various exemplary embodiments of the present invention are directed to a semiconductor device that supports a data input/output protocol commonly for a plurality of fuse arrays, a semiconductor repair system including the semiconductor device, and a method for operating the semiconductor device.

In accordance with an embodiment of the present invention, a semiconductor device includes: a plurality of fuse arrays each including a plurality of fuses; a selection block suitable for selecting one fuse array among the fuse arrays in response to values of a group of bits of a repair code; a code alignment block suitable for arranging bits of the repair code other than the group of bits of the repair code, wherein the arrangement corresponds to the fuse array selected by the selection block; and an operation block suitable for controlling an operation of the fuse array selected by the selection block in response to a repair command, and an output code of the code alignment block.

Each of the fuse arrays may include a different number of fuses arranged in an array.

The repair code may include a selection code corresponding to the group of bits of the repair code, and an information code corresponding to the bits of the repair code other than the group of bits of the repair code. The information code may include an address code for selecting the fuses included in the fuse array, which is selected by the selection block, and a data code, which is used for operations of the fuses selected based on the address code.

The selection block may enable a single fuse array among the fuse arrays, and disables the other fuse arrays in response to a value of the selection code.

The code alignment block may control the number of bits of the address code, and the number of bits of the data code among the information code based on the fuse array, which is selected by the selection block.

The operation block may include: a fuse selection unit suitable for selecting a predetermined number of fuses among the fuses included in the fuse array, which is selected by the selection block in response to the address code; and a fuse operation unit suitable for performing a rupture or read operation on the fuses selected by the fuse selection unit in response to the repair command.

The fuse operation unit may program a value of the data code in the fuses selected by the fuse selection unit during the rupture operation in response to the repair command.

The fuse operation unit may select a portion of fuses corresponding to the value of the data code among the fuses selected by the fuse selection unit, and outputs data stored in the fuses which are selected by the fuse operation unit through a predetermined pad, during the read operation in response to the repair command.

In accordance with another embodiment of the present invention, a semiconductor repair system includes: a repair controller suitable for generating a repair command and a repair code; and a semiconductor device having a plurality of fuse arrays each including a plurality of fuses, and suitable for controlling each operation of the fuse arrays by receiving the repair code through a predetermined first pad and receiving the repair command through a predetermined second pad, wherein the semiconductor device includes: a selection block suitable for selecting one fuse array among the fuse arrays in response to values of a group of bits of the repair code; a code alignment block suitable for arranging the bits of the repair code other than the group of bits of the repair code, wherein the arrangement corresponds to the fuse array selected by the selection block; and an operation block suitable for controlling an operation of the fuse array selected by the selection block in response to the repair command, and an output code of the code alignment block.

Each of the fuse arrays may include a different number of fuses arranged in an array.

The repair code may include a selection code corresponding to the group of the bits of the repair code, and an information code corresponding to the bits of the repair code other than the group of the bits of the repair code. The information code may include an address code for selecting the fuses included in the fuse array which is selected by the selection block, and a data code, which is used for operations of the fuses selected based on the address code.

The selection block may enable a single fuse array among the fuse arrays and disables the other fuse arrays in response to a value of the selection code.

The code alignment block may control the number of bits of the address code, and the number of bits of the data code among the information code based on the fuse array, which is selected by the selection block.

The operation block may include: a fuse selection unit suitable for selecting a predetermined number of fuses among the fuses included in the fuse array, which is selected by the selection block in response to the address code; and a fuse operation unit suitable for performing a rupture or read operation on the fuses selected by the fuse selection unit in response to the repair command.

The fuse operation unit may program a value of the data code in the fuses selected by the fuse selection unit during the rupture operation in response to the repair command.

The fuse operation unit may select a group of fuses corresponding to the value of the data code among the fuses selected by the fuse selection unit, and outputs data stored in the fuses, which are selected by the fuse operation unit through a predetermined third pad, during the read operation in response to the repair command.

In accordance with another embodiment of the present invention, a method for operating a semiconductor device including a plurality of fuse arrays each having a plurality of fuses includes: selecting one fuse array among the fuse arrays in response to values of a group of bits of a repair code; generating a repair alignment code by arranging the bits of the repair code other than the group of the bits of the repair code, wherein the arrangement corresponds to the fuse array selected by the selecting of the fuse array, and controlling an operation of the fuse array selected by the selecting of the fuse array in response to a repair command and the repair alignment code.

The repair code may include a selection code corresponding to the group of the bits of the repair code, and an information code corresponding to the bits of the repair code other than the group of the bits of the repair code. The information code may include an address code for selecting the fuses included in the fuse array selected by the selecting of the fuse array, and a data code, which is used for operations of the fuses selected based on the address code.

The generating of the repair alignment code may output the repair alignment code by controlling the number of bits of the address code, and the number of bits of the data code among the information code based on the fuse array selected by the selecting of the fuse array.

The controlling of the operation of the fuse array may include: selecting a predetermined number of fuses among the fuses included in the fuse array, which is selected by the selecting of the fuse array in response to the address code; programming a value of the data code in the fuses selected by the selecting of the predetermined number of fuses during a rupture operation in response to the repair command; and selecting a group of fuses corresponding to the value of the data code among the fuses selected by the selecting of the predetermined number of fuses, and outputting data stored in the fuses, which are selected by the selecting of the predetermined number of fuses through a predetermined pad, during a read operation in response to the repair command.

BRIEF DESCRIPTION OF THE DRAWINGS

FIG. 2 illustrates a protocol used in the semiconductor device shown in FIG. 1.

FIG. 4 illustrates an operation of a code alignment block shown in FIG. 3.

DETAILED DESCRIPTION

Exemplary embodiments of the present invention are described below in more detail with reference to the accompanying drawings. These embodiments are provided so that this disclosure is thorough and complete, and fully conveys the scope of the present invention to those skilled in the art.

First Embodiment

Figure 1:
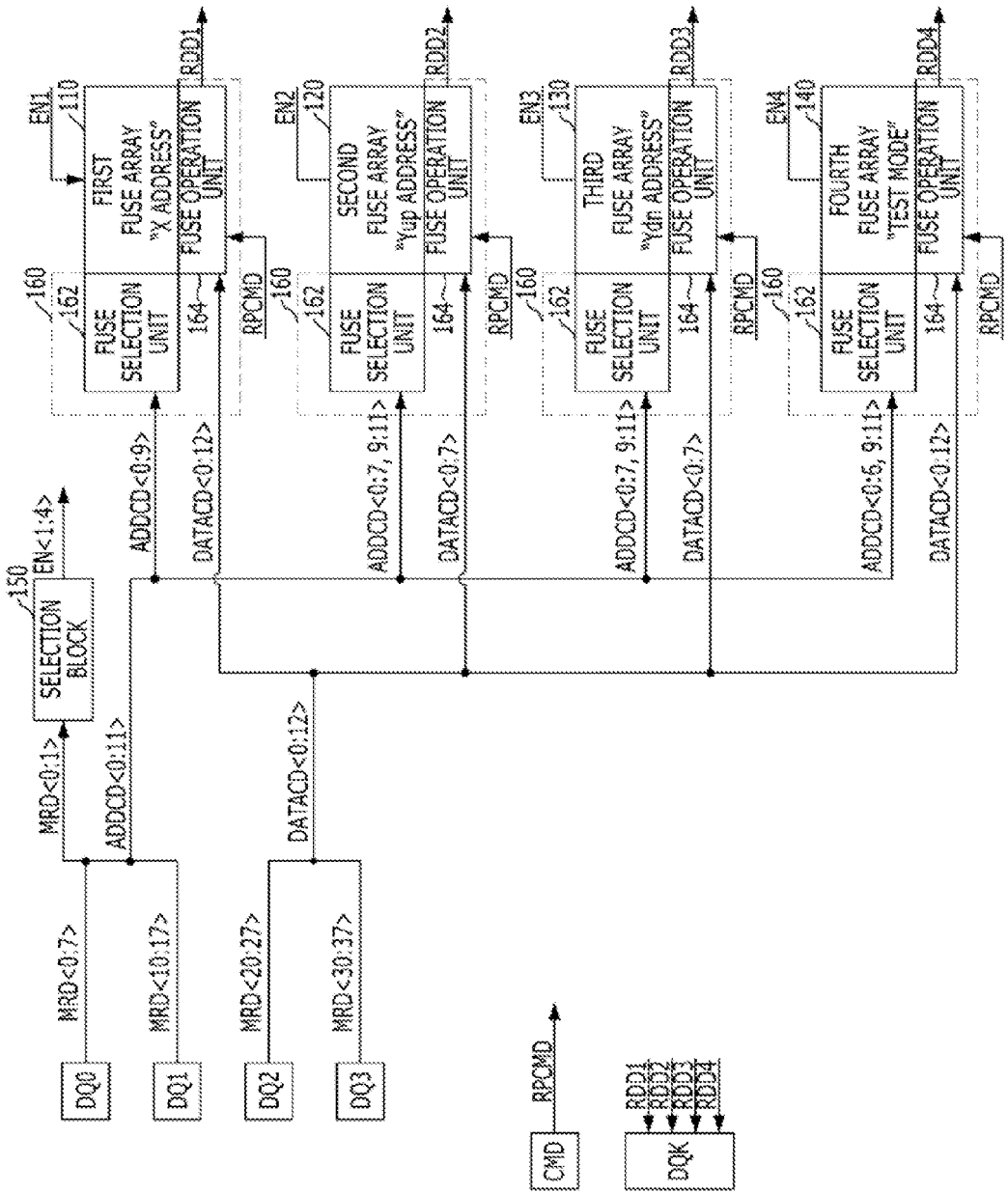
FIG. 1 illustrates a semiconductor device in accordance with a first embodiment of the present invention.

FIG. 1 illustrates a semiconductor device in accordance with a first embodiment of the present invention.

Referring to FIG. 1, the semiconductor device supporting a protocol for a plurality of fuse arrays 110 to 140 in common may include the fuse arrays 110 to 140, a selection block 150, and a plurality of operation blocks 160. The plurality of operation blocks 160 may correspond to the plurality of fuse arrays 110 to 140, respectively. Each of the plurality operation blocks 160 may include a fuse selection unit 162 and a fuse operation unit 164.

Although not directly illustrated, a plurality of fuses may be disposed in an array shape in each of the fuse arrays 110 to 140. For example, when the semiconductor device is a semiconductor memory device, the first fuse array 110 among the fuse arrays 110 to 140 may include information in relation to a row address X ADDRESS for a memory cell repair operation, and the second and third fuse arrays 120 and 130 may include information in relation to column addresses Yup ADDRESS and Ydn ADDRESS for the memory cell repair operation, and the fourth fuse array 140 may include information in relation to a test mode operation TEST MODE of the semiconductor memory device.

The number of the fuses included in each of the fuse arrays 110 to 140 may be different from each other.

Figure 7:
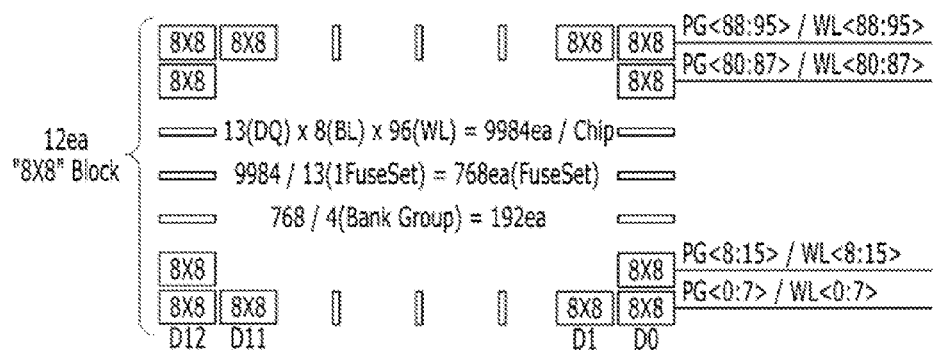
FIG. 7 illustrates a first example of a fuse array shown in FIGS. 2 and 3.
Figure 8:
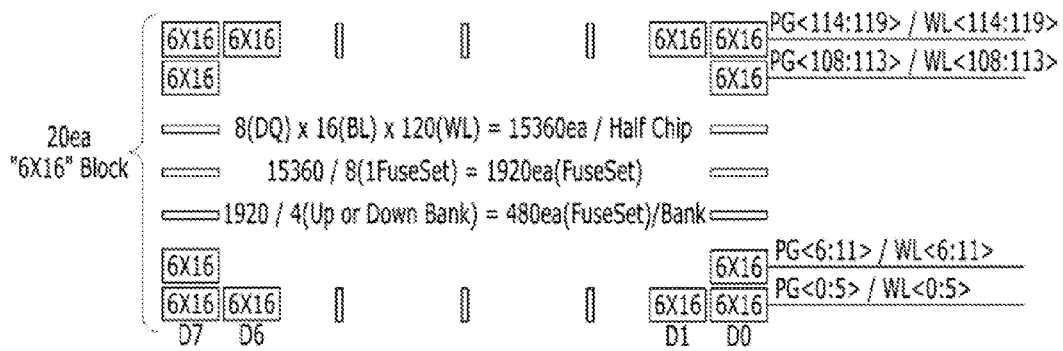
FIG. 8 illustrates a second example of a fuse array shown in FIGS. 2 and 3.
Figure 9:
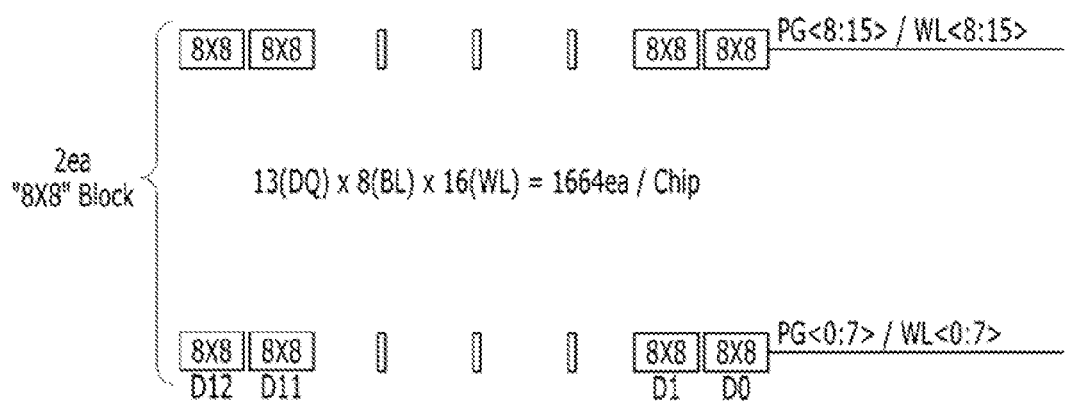
FIG. 9 illustrates a third example of a fuse array shown in FIGS. 2 and 3.

FIGS. 7 to 9 illustrate first to third examples of the fuse arrays 110 to 140 shown in FIG. 2.

For example, when the semiconductor device is a semiconductor memory device, the number of the fuses included in the first fuse array 110 may be 9984 since the first fuse array 110 may include the information in relation to the row address X ADDRESS as shown in FIG. 7, and the number of fuses included in the second fuse array 120 may be 15360 since the second fuse array 120 may include the information in relation to the upper column address Yup ADDRESS as shown in FIG. 8. As shown in FIG. 9, the number of the fuses included in the fourth fuse array 140 may be 1664 since the fourth fuse array 140 may include the information in relation to the test mode operation TEST MODE.

As another example, the number of the fuses included in a portion of the fuse arrays 110 to 140 may be the same. For example, when the semiconductor device is a semiconductor memory device, the number of the fuses included in the second fuse array 120 and the number of the fuses included in the third fuse array 130 may be 15360, individually, as shown in FIG. 8, since the second and third fuse arrays 120 and 130 may be the same when the second fuse array 120 may include the information in relation to the upper column address Yup ADDRESS, and the third fuse array 130 may include the information in relation to the lower column address Ydn ADDRESS.

Referring to FIG. 1, the selection block 150 may select one fuse array among the fuse arrays 110 to 140 in response to values of a selection code MRD<0:1> included in a repair code MRD<0:7>, MRD<10:17>, MRD<20:27> and MRD<30:37> having fixed data arrangement. For example, when the values of the bits MRD<0:1> are set to '0 0', an array selection signal EN1 for enabling the first fuse array 110 may be enabled, and array selection signals EN2, EN3 and EN4 for enabling the other fuse arrays 120, 130 and 140 may be disabled. When the values of the bits MRD<0:1> are set to '1 0', the array selection signal EN2 for enabling the second fuse array 120 may be enabled, and the array selection signals EN1, EN3 and EN4 for enabling the other fuse arrays 110, 130 and 140 may be disabled. When the values of the bits MRD<0:1> are set to '0 1', the array selection signal EN3 for enabling the third fuse array 130 may be enabled, and the array selection signals EN1, EN2 and EN4 for enabling the other fuse arrays 110, 120 and 140 may be disabled. When the values of the bits MRD<0:1> are set to '1 1', the array selection signal EN4 for enabling the fourth fuse array 140 may be enabled, and the array selection signals EN1, EN2 and EN3 for enabling the other fuse arrays 110, 120 and 130 may be disabled. In this manner, the selection block 150 may select one fuse array among the fuse arrays 110 to 140 to operate.

The operation block 160 may control an operation of a selected one among the fuse array 110 to 140 which is selected by the selection block 150 through the array selection signals E1 to E4, in response to a repair command RPCMD and the repair code MRD<0:7>, MRD<10:17>, MRD<20:27> and MRD<30:37> having fixed data arrangement.

The remaining code other than the selection code MRD<0:1> of the repair code MRD<0:7>, MRD<10:17>, MRD<20:27> and MRD<30:37> having fixed data arrangement, that is, the code MRD<2:7>, MRD<10:17>, MRD<20:27> and MRD<30:37> is referred to as an information code, which includes information for controlling the operation of the selected one among the fuse array 110 to 140.

The information code MRD<2:7>, MRD<10:17> may include an address code ADDCD<0:11> for selecting the fuses included in the selected one among the fuse array 110 to 140 and reserved 2 bits. The information code MRD<20:27> and MRD<30:37> may include a data code DATACD<0:12> for operations of the fuses selected based on the address code ADDCD<0:11> and reserved 3 bits.

The address code ADDCD<0:11> included in the information code MRD<2:7> and MRD<10:17> may be transferred through first and second pads DQ0 and DQ1. The data code DATACD<0:12> included in the information code MRD<20:27> and MRD<30:37> may be transferred through third and fourth pads DQ2 and DQ3.

Predetermined bit arrangements of the address code ADDCD<0:11> and the data code DATACD<0:12> for each of the plurality of the fuse arrays 110 to 140, which are included in the repair code MRD<0:7>, MRD<10:17>, MRD<20:27> and MRD<30:37> having fixed data arrangement may be transferred from an exterior to the fuse arrays 110 to 140 through the first to fourth pads DQ0 to DQ3. The plurality of operation blocks 160 respectively corresponding to the fuse arrays 110 to 140 may operate by receiving the address code ADDCD<0:11> and the data code DATACD<0:12> of the predetermined bit arrangement for the corresponding one of the fuse arrays 110 to 140.

To be specific, the repair code MRD<0:7> and MRD<10:17> having fixed data arrangement may be inputted just through the first and second pads DQ0 and DQ1, and the address code ADDCD<0:11> and the data code DATACD<0:12> of the predetermined bit arrangement for the corresponding one of the fuse arrays 110 to 140 are selectively and directly transmitted.

For example, the operation block 160 corresponding to the first fuse array 110 may operate by receiving just the upper 10 bits ADDCD<0:9> of the 12-bit address code ADDCD<0:11>. Each of the operation blocks 160 respectively corresponding to the second and third fuse arrays 120 and 130 may operate by receiving just the upper 8 bits, a $10^{th}$ to $12^{th}$ bits ADDCD<0:7, 9:11> of the 12-bit address code ADDCD<0:11>. The operation block 160 corresponding to the fourth fuse array 140 may operate by receiving just the upper 7 bits, $9^{th}$ and $10^{th}$ bits ADDCD<0:6, 8, 9> of the 12-bit address code ADDCD<0:11 To summarize, the address code ADDCD<0:11> of the predetermined bit arrangement, which is included in the repair code MRD<0:7> and MRD<10:17> of fixed data arrangement inputted through the first and second pads DQ0 and DQ1, may be commonly transferred to the plurality of operation blocks 160, and one of the plurality of operation blocks 160 corresponding to the address code ADDCD<0:11> of the predetermined bit arrangement may perform operations.

Similarly, the repair code MRD<20:27> and MRD<30:37> having fixed data arrangement may be inputted just through the third and fourth pads DQ2 and DQ3, and the data code DATACD<0:12> of the predetermined bit arrangement for the corresponding one of the fuse arrays 110 to 140 are selectively and directly transmitted.

For example, each of the operation blocks 160 corresponding to the first and fourth fuse arrays 110 and 140 may operate by receiving all 13 bits of the data code DATACD<0:12>. Each of the operation blocks 160 corresponding to the second and third fuse arrays 120 and 130 may operate by receiving just the upper 8 bits DATACD<0:7> of the 13-bit data code DATACD<0:12>. To summarize, the data code DATACD<0:12> of the predetermined bit arrangement, which is included in the repair code MRD<20:27> and MRD<30:37> of fixed data arrangement inputted through the third and fourth pads DQ2 and DQ3, may be commonly transferred to the plurality of operation blocks 160, and one of the plurality of operation blocks 160 corresponding to the data code DATACD<0:12> of the predetermined bit arrangement may perform operations.

The fuse selection unit 162 may select the predetermined number of fuses among a plurality of fuses (not shown) included in selected one among one among the fuse array 110 to 140, which is selected by the selection block 150 through the array selection signal's E1 to E4, in response to the address code ADDCD<0:11> of the predetermined bit arrangement.

The number of the fuses selected in response to the address code ADDCD<0:11> of the predetermined bit arrangement, i.e., a predetermined number of the fuses, may correspond to the number of bits of the data code DATACD<0:12> of the predetermined bit arrangement.

The fuse operation unit 164 may perform a rupture operation or a read operation on the fuses selected according to the address code ADDCD<0:11> of the predetermined bit arrangement in response to the repair command RPCMD.

When the fuse operation unit 164 performs the rupture operation in response to the repair command RPCMD, the value of the data code DATACD<0:12> may be programmed in the fuses selected in response to the address code ADDCD<0:11> of the predetermined bit arrangement.

When the fuse operation unit 164 performs the read operation in response to the repair command RPCMD, a group of fuses corresponding to the value of the data code DATACD<0:12> of the predetermined bit arrangement among the fuses selected in response to the address code ADDCD<0:11> of the predetermined bit arrangement may be selected, and data RDD1, RDD2, RDD3 or RDD4 stored in the selected fuses may be outputted through a predetermined pad DQK.

FIG. 2 illustrates the protocol used in the semiconductor device shown in FIG. 1.

FIG. 2 shows the relationship between the repair code MRD<0:7>, MRD<10:17>, MRD<20:27> and MRD<30:37> having fixed data arrangement and the address code ADDCD<0:11> and the data code DATACD<0:12>.

To be specific, a $0^{th}$ bit and a $1^{st}$ bit MRD<0:1> of the repair code MRD<0:7>, MRD<10:17>, MRD<20:27> and MRD<30:37> may become the selection code MRD<0:12>.

Third to $6^{th}$ bits MRD<3:6> and $10^{th}$ to $17^{th}$ bits MRD<10:17> among the repair code MRD<0:7>, MRD<10:17>, MRD<20:27> and MRD<30:37> become the address code ADDCD<0:11>, $20^{th}$ to $27^{th}$ bits MRD<20:27> and $30^{th}$ to $34^{th}$ bits MRD<30:34> of the repair code MRD<0:7>, MRD<10:17>, MRD<20:27> and MRD<30:37> become the data code DATACD<0:12>.

The $2^{nd}$ bit. MRD<2> and $7^{th}$ bit MRD<7> are the aforementioned reserved 2 bits included in the information code MRD<2:7>, MRD<10:17>, and the 35th to $37^{th}$ bits MRD<35:37> are the aforementioned reserved 3 bits included in the information code MRD<20:27> and MRD<30:37>.

Meanwhile, the data of 12 bits of the address code ADDCD<0:11> may have a predetermined bit arrangement for each of the fuse arrays 110 to 140.

For example, as shown in the drawing, the address code ADDCD<0:9> for the first fuse array 110 for storing information in relation to the row address X ADDRESS may have 10 bits of data with null data of 3 and $4^{th}$ bits MRD<3:4>.

The address code ADDCD<0:6, 8:9> for the fourth fuse array 140 for storing information in relation to the test mode operation TEST MODE may have 9 bits of data with null data of $3^{rd}$ and $4^{th}$ bits MRD<3:4> and a $10^{th}$ bit MRD<10>.

The address code ADDCD<0:7, 9:11> for each of the second and third fuse arrays 120 and 130 for storing information in relation to the column addresses Yup ADDRESS and Ydn ADDRESS may have 11 bits of data with null data of $6^{th}$ bit MRD<6>.

Similarly, the data of 13 bits of the data code DATACD<0:12> may have the predetermined bit arrangement for each of the fuse arrays 110 to 140.

For example, as shown in the drawing, the data code DATACD<0:12> for the first fuse array 110 for storing information in relation to the row address X ADDRESS may have all of 13 bits of data with no null data.

The data code DATACD<0:12> for the fourth fuse array 140 for storing information in relation to the test mode operation TEST MODE may have all of 13 bits of data with no null data.

The data code DATACD<0:7> for each of the second and third fuse arrays 120 and 130 for storing information in relation to the column addresses Yup ADDRESS and Ydn ADDRESS may have 8 bits of data with null data of $20^{th}$ to $24^{th}$ bits MRD<20:24>.

As described above, the 12 bits which are secured as the address code ADDCD<0:11> are not all required in the first to fourth fuse arrays 110 to 140. Similarly, the 13 bits which are secured as the data codes DATACD<0:12> are all required just in the first and fourth fuse arrays 110 and 140, and they are not all required in the second and third fuse arrays 120 and 130.

The 12-bit address code ADDCD<0:11> and the 13-bit data code DATACD<0:12> are not all required in the fuse arrays 110 to 140. Nevertheless, as shown in the drawing, an occupying area of the address code ADDCD<0:11> is obviously fixed as the 12 bits, and an occupying area of the data code DATACD<0:12> is obviously fixed as the 13 bits due to the following two reasons.

The first reason is that the address code ADDCD<0:11> and the data code DATACD<0:12> of the various predetermined bit arrangements should carry various lengths of data, especially a maximum length of data, for each of the fuse arrays 110 to 140.

The second reason is that it is easy to simplify a signal input path through separation of the input path into the first and second pads DQ0 and DQ1 dedicated to the address code ADDCD<0:11> and the third and fourth pads DQ2 and DQ3 dedicated to the data code DATACD<0:12>.

The repair code MRD<0:7>, MRD<10:17>, MRD<20:27> and MRD<30:37> having fixed data arrangement may be inputted in parallel by 8 bits through the first to fourth pads DQ0 to DQ3 in order to transfer the 12-bit address code ADDCD<0:11> of the predetermined arrangement through the first and second pads DQ0 and DQ1 and to transfer the 13-bit data code DATACD<0:12> of the predetermined arrangement through the third and fourth pads DQ2 and DQ3 to the corresponding operation block 160. In other words, the first 8 bits repair code MRD<0:7> may be inputted in series through the first pad DQ0, and the second 8 bits repair code MRD<10:17> may be inputted in series through the second pad DQ1, and the third 8 bits repair code MRD<20:27> may be inputted in series through the third pad DQ2, and the fourth 8 bits repair code MRD<30:37> may be inputted in series through the fourth pad DQ3.

In accordance with the first embodiment of the present invention as described above, the address code ADDCD<0:11> of the predetermined bit arrangement, which is included in the repair code MRD<0:7> and MRD<10:17> of fixed data arrangement inputted through the first and second pads DQ0 and DQ1, may be commonly transferred to the plurality of operation blocks 160, and one of the plurality of operation blocks 160 corresponding to the address code ADDCD<0:11> of the predetermined bit arrangement may perform operations, and the data code DATACD<0:12> of the predetermined bit arrangement, which is included in the repair code MRD<20:27> and MRD<30:37> of fixed data arrangement inputted through the third and fourth pads DQ2 and DQ3, may be commonly transferred to the plurality of operation blocks 160, and one of the plurality of operation blocks 160 corresponding to the data code DATACD<0:12> of the predetermined bit arrangement may perform operations. Consequently, it is possible to transmit the control code capable of controlling the operations of the fuse arrays 110 to 140 having the various bit arrangements in common to one protocol.

Second Embodiment

Figure 3:
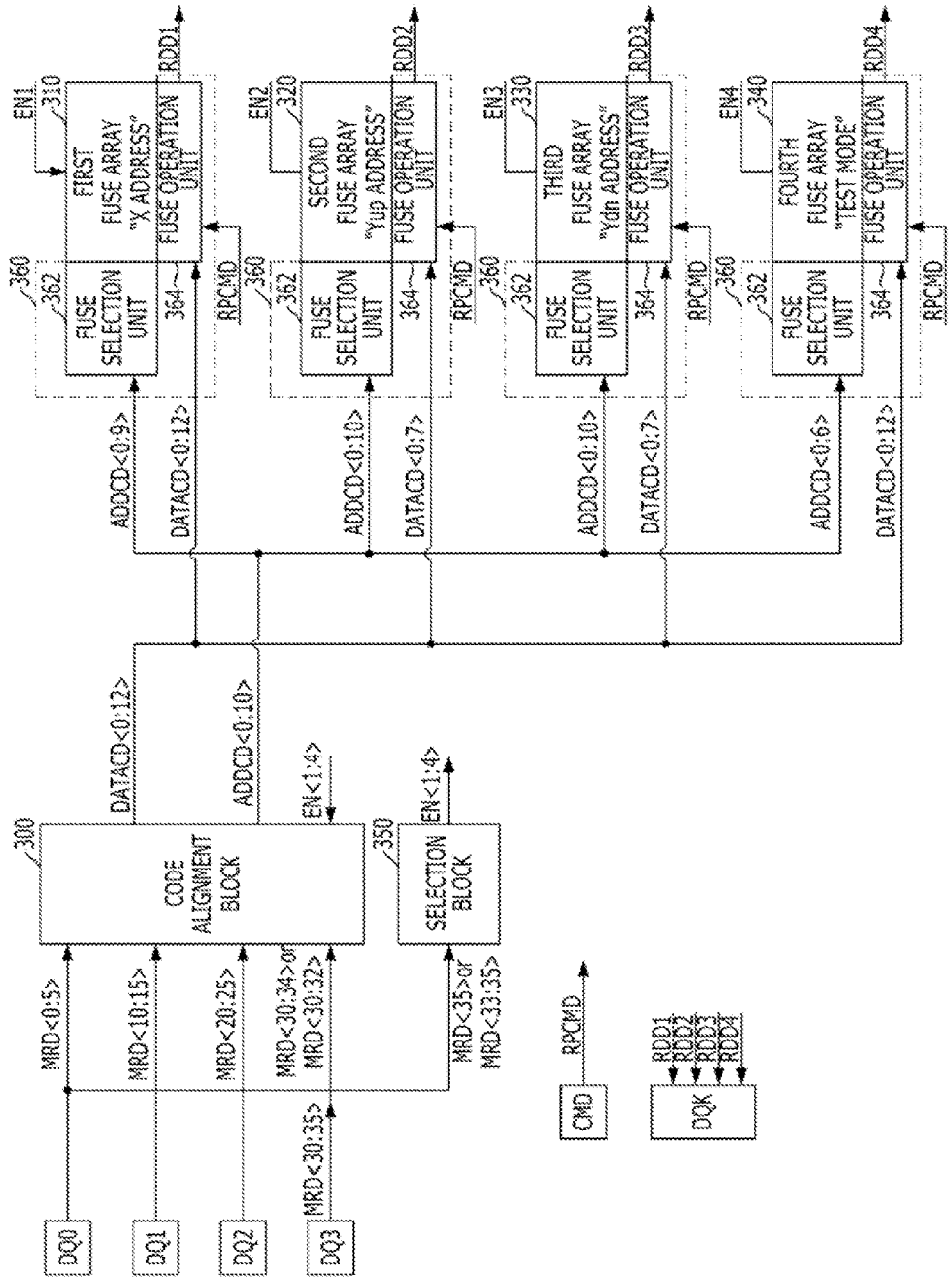
FIG. 3 illustrates a semiconductor device in accordance with a second embodiment of the present invention.

FIG. 3 illustrates a semiconductor device in accordance with a second embodiment of the present invention.

Referring to FIG. 3, the semiconductor device supporting a protocol for a plurality of fuse arrays 310 to 340 in common may include the fuse arrays 310 to 340, a code alignment block 300, a selection block 350 and an operation block 360. The plurality of operation blocks 360 may correspond to the plurality of fuse arrays 310 to 340, respectively. Each of the plurality operation blocks 360 may include a fuse selection unit 362 and a fuse operation unit 364.

Although not directly illustrated, a plurality of fuses may be disposed in an array shape in each of the fuse arrays 310 to 340. For example, when the semiconductor device is a semiconductor memory device, the first fuse array 310 among the fuse arrays 310 to 340 may include information in relation to a row address X ADDRESS for a memory cell repair operation, and the second and third fuse arrays 320 and 330 may include information in relation to column addresses Yup ADDRESS and Ydn ADDRESS for the memory cell repair operation, and the fourth fuse array 340 may include information in relation to a test mode operation TEST MODE of the semiconductor memory device.

The number of fuses included in each of the fuse arrays 310 to 340 may be different from each other.

FIGS. 7 to 9 illustrate first to third examples of the fuse arrays 310 to 340 shown in FIG. 3.

For example, when the semiconductor device is a semiconductor memory device, the number of the fuses included in the first fuse array 310 may be 9984 since the first fuse array 310 may include the information in relation to the row address X ADDRESS as shown in FIG. 7, and the number of the fuses included in the second fuse array 320 may be 15360 since the second fuse array 320 may include the information in relation to the upper column address Yup ADDRESS as shown in FIG. 8. As shown in FIG. 9, the number of the fuses included in the fourth fuse array 340 may be 1664 since the fourth fuse array 340 may include the information in relation to the test mode operation TEST MODE.

As another example, the number of the fuses included in a portion of the fuse arrays 310 to 340 may be the same. For example, when the semiconductor device is a semiconductor memory device, the number of fuses included in the second fuse array 320 and the number of the fuses included in the third fuse array 330 may be 15360, individually, as shown in FIG. 8, since the second and third fuse arrays 320 and 330 may be the same when the second fuse array 320 may include the information in relation to the upper column address Yup ADDRESS and the third fuse array 330 may include the information in relation to the lower column address Ydn ADDRESS.

Referring to FIG. 3, the selection block 350 may select one fuse array among the fuse arrays 310 to 340 in response to values of a selection code MRD<35> or MRD<33:35> included in a repair code MRD<0:5>, MRD<10:15>, MRD<20:25> and MRD<30:35> having a variable length of consecutive data. For example, when the value of the last bit MRD<35> among the bits MRD<33:35> is set to '0', an array selection signal EN1 for enabling the first fuse array 310 may be enabled, and array selection signals EN2, EN3 and EN4 for enabling the other fuse arrays 320, 330 and 340 may be disabled, regardless of the values of the other bits MRD<33:34>. When the value of the last bit MRD<35> among the bits MRD<33:35> is set to '1', and the values of the other bits MRD<33:34> are '0 1', the array selection signal EN2 for enabling the second fuse array 320 may be enabled, and the array selection signals EN1 EN3 and EN4 for enabling the other fuse arrays 310, 330 and 340 may be disabled. When the value of the last bit MRD<35> among the bits MRD<33:35> is set to '1', and the values of the other bits MRD<33:34> are '1 0', the array selection signal EN3 for enabling the third fuse array 330 may be enabled, and the array selection signals EN1, EN2 and EN4 for enabling the other fuse arrays 310, 320 and 340 may be disabled. When the value of the last bit MRD<35> among the bits MRD<33:35> is set to '1', and the values of the other bits MRD<33:34> are '1 1', the array selection signal EN4 for enabling the fourth fuse array 340 may be enabled, and the array selection signals EN1, EN2 and EN3 for enabling the other fuse arrays 310, 320 and 330 may be disabled. In this manner, the selection block 350 may select one fuse array among the fuse arrays 310 to 340 to operate.

The selection block 350 in accordance with the second embodiment of the present invention may perform a completely different operation from the selection block 150 described with reference to FIGS. 1 and 2. In other words, the selection block 350 may check the value of the last bit MRD<35> among the bits MRD<33:35> firstly, and then check the values of the other bits MRD<33:34> just when the value of the bit MRD<35> is set to '1'. Consequently, when the value of the last bit MRD<35> among the bits MRD<33:35> is set to '0', it is possible to use the other bits MRD<33:34> for another purpose irrelevant to the operation of the selection block 350.

The selection block 350 in accordance with the second embodiment of the present invention may use or not user the other bits MRD<33:34> for the operation based on the value of the last bit MRD<35> among the bits MRD<33:35>. In other words, when the other bits MRD<33:34> are not used for the operation of the selection block 350, the bits MRD<33:34> may not be included in the bits MRD<33:35> of the repair code MRD<0:5>, MRD<10:15>, MRD<20:25> and MRD<30:35> having a variable length of consecutive data, and may be included in the other bits MRD<0:5>, MRD<10:15 MRD<20:25> and MRD<30:34> of the repair code MRD<0:5>, MRD<10:15>, MRD<20:25> and MRD<30:35> having a variable length of consecutive data. When the bits MRD<33:34> are used for the operation of the selection block 350, the bits MRD<33:34> may be included in the bits MRD<33:35> of the repair code MRD<0:5>, MRD<10:15>, MRD<20:25> and MRD<30:35> having a variable length of consecutive data.

The reference numerals of the bits of the selection code MRD<33:35> of the repair code MRD<0:5>, MRD<10:15>, MRD<20:25> and MRD<30:35>, which are to be described below based on the operation of the selection block 350, are represented by 'MRD<35> or MRD<33:35>'. Similarly, the reference numerals of the other bits of the remaining code other than the selection code MRD<35> or MRD<33:35>, that is, the code MRD<0:5>, MRD<10:15>, MRD<20:25> and MRD<30:34> of the repair code MRD<0:5>, MRD<10: 15>, MRD<20:25> and MRD<30:35>, which are to be described below based on the operation of the selection block 350, is represented by 'MRD<0:5>, MRD<10:15>, MRD<20:25> and MRD<30:34> or MRD<30:32>', and is referred to as an information code, which includes information for controlling the operation of the selected one among the fuse array 310 to 340.

The code alignment block 300 may arrange the bits of the information code MRD<0:5>, MRD<10:15>, MRD<20:25> and MRD<30:34> or MRD<30:32> except for the bits of the selection code MRD<35> or MRD<33:35> of the repair code MRD<0:5> MRD<10:15>, MRD<20:25> and MRD<30: 35> having a variable length of consecutive data, wherein each of the bit arrangements may correspond to the fuse array 310 to 340, respectively, and may be different from each other.

The operation block 360 may control an operation of a selected one among the fuse array 310 to 340, which is selected by the selection block 350 through the array selection signals E1 to E4, in response to a repair command RPCMD, and the arranged code ADDRCD<0:10> and DATACD<0:12> from the code alignment block 300.

The information code MRD<0:5 MRD<10:15>, MRD<20:25> and MRD<30:34> or MRD<30:32> may include an address code ADDCD<0:10> for selecting the fuses included in the selected one among the fuse array 310 to 340, and data code DATACD<0:12> for operations of the fuses selected based on the address code ADDCD<0:10>.

The code alignment block 300 may arrange the information code MRD<0:5>, MRD<10:15>, MRD<20:25> and MRD<30:34> or MRD<30:32> as the address code ADDCD<0:10> and the data code DATACD<0:12> for selecting the fuses included in the selected one among the fuse arrays 310 to 340.

In other words, in the second embodiment, unlike the first embodiment, the disposition of the bits of the information code MRD<0:5>, MRD<10:15>, MRD<20:25> and MRD<30:34> or MRD<30:32> may have a variable length of consecutive data. The code alignment block 300 may arrange data bits of the address code ADDCD<0:10> and the data code DATACD<0:12> from the information code MRD<0:5>, MRD<10:15>, MRD<20:25> and MRD<30:34> or MRD<30:32> for the selected one among the fuse arrays 310 to 340.

The information code MRD<0:5>, MRD<10:15>, MRD<20:25> and MRD<30:34> or MRD<30:32> may have a total of 24 data bits, and all 24 bits of the information code MRD<0:5>, MRD<10:15>, MRD<20:25> and MRD<30:34> or MRD<30:32> without null data may be arranged as the 11 data bits of the address code ADDCD<0:10> and the 13 data bits of the data code DATACD<0:12>. Therefore, the information code MRD<0:5>, MRD<10:15>, MRD<20:25> and MRD<30:34> or MRD<30:32> may have a compact length of data without null data.

The address code ADDCD<0:11> and the data code DATACD<0:12> for each of the plurality of the fuse arrays 310 to 340, which are included in the information code MRD<0:5>, MRD<10:15>, MRD<20:25> and MRD<30:34> or MRD<30:32>, may be transferred from an exterior to the fuse arrays 310 to 340 through the first to fourth pads DQ0 to DQ3 and through the bit arrangement by the code alignment block 300. The plurality of operation blocks 150 respectively corresponding to the fuse arrays 310 to 340 may operate by receiving the address code ADDCD<0:11> and the data code DATACD<0:12> of the predetermined bit arrangement for the corresponding one of the fuse arrays 310 to 340.

To be specific, the code alignment block 300 may arrange and transmit the address code ADDCD<0:10> and the data code DATACD<0:12> for the selected one among the fuse arrays 310 to 340 to the plurality of operation blocks 360.

For example, the code alignment block 300 may arrange and transmit the address code ADDCD<0:9> of the upper 10 bits among the 11-bit address code ADDCD<0:10> to the operation block 360 of the first fuse array 310, and may arrange and transmit the 13-bit data code DATACD<0:12> to the operation block 360 of the first fuse array 310. The code alignment block 300 may arrange and transmit the 11-bit address code ADDCD<0:10> to the operation block 360 corresponding to the second fuse array 320 or the third fuse array 330, and may arrange and transmit the data code DATACD<0:7> of the upper 8 bits among the 13-bit data code DATACD<0:12> to the operation block 360 corresponding to the second fuse array 320 or the third fuse array 330. Furthermore, the code alignment block 300 may arrange and transmit the address code ADDCD<0:6> of the upper 7 bits among the 11-bit address code ADDCD<0:10> to the operation block 360 corresponding to the fourth fuse array 340, and may arrange and transmit the data code DATACD<0:7> of the upper 13 bits among the 13-bit data code DATACD<0:12> to the operation block 360 corresponding to the fourth fuse array 340. To summarize, the bit-arranged address code ADDCD<0:11>, which is included in the information code MRD<0:5>, MRD<10:15>, MRD<20:25> and MRD<30:34> or MRD<30:32> inputted through the first to fourth pads DQ0 to DQ3, may be commonly transferred to the plurality of operation blocks 360, and one of the plurality of operation blocks 360 corresponding to the bit-arranged address code ADDCD<0:11> may perform operations.

The fuse selection unit 362 may select the predetermined number of fuses among a plurality of fuses (not shown) included in the selected one among the fuse arrays 310 to 340, which is selected by the selection block 350 through the array selection signals E1 to E4, in response to the bit-arranged address code ADDCD<0:10>.

The number of the fuses selected in response to the bit-arranged address code ADDCD<0:11>, i.e., a predetermined number of the fuses, may correspond to the number of bits of the bit-arranged data code DATACD<0:12>.

The fuse operation unit 364 may perform a rupture operation or a read operation on the fuses selected according to the bit-arranged address code ADDCD<0:1> in response to the repair command RPCMD.

When the fuse operation unit 364 performs the rupture operation in response to the repair command RPCMD, the value of the data code DATACD<0:12> may be programmed to the fuses selected in response to the bit-arranged address code ADDCD<0:11>.

When the fuse operation unit 364 performs the read operation in response to the repair command RPCMD, some fuses corresponding to the value of the bit-arranged data code DATACD<0:12> among the fuses selected in response to the bit-arranged address code ADDCD<0:11> may be selected, and data RDD1, RDD2, RDD3 or RDD4 stored in the selected fuses may be outputted through a predetermined pad DQK.

Figure 4:
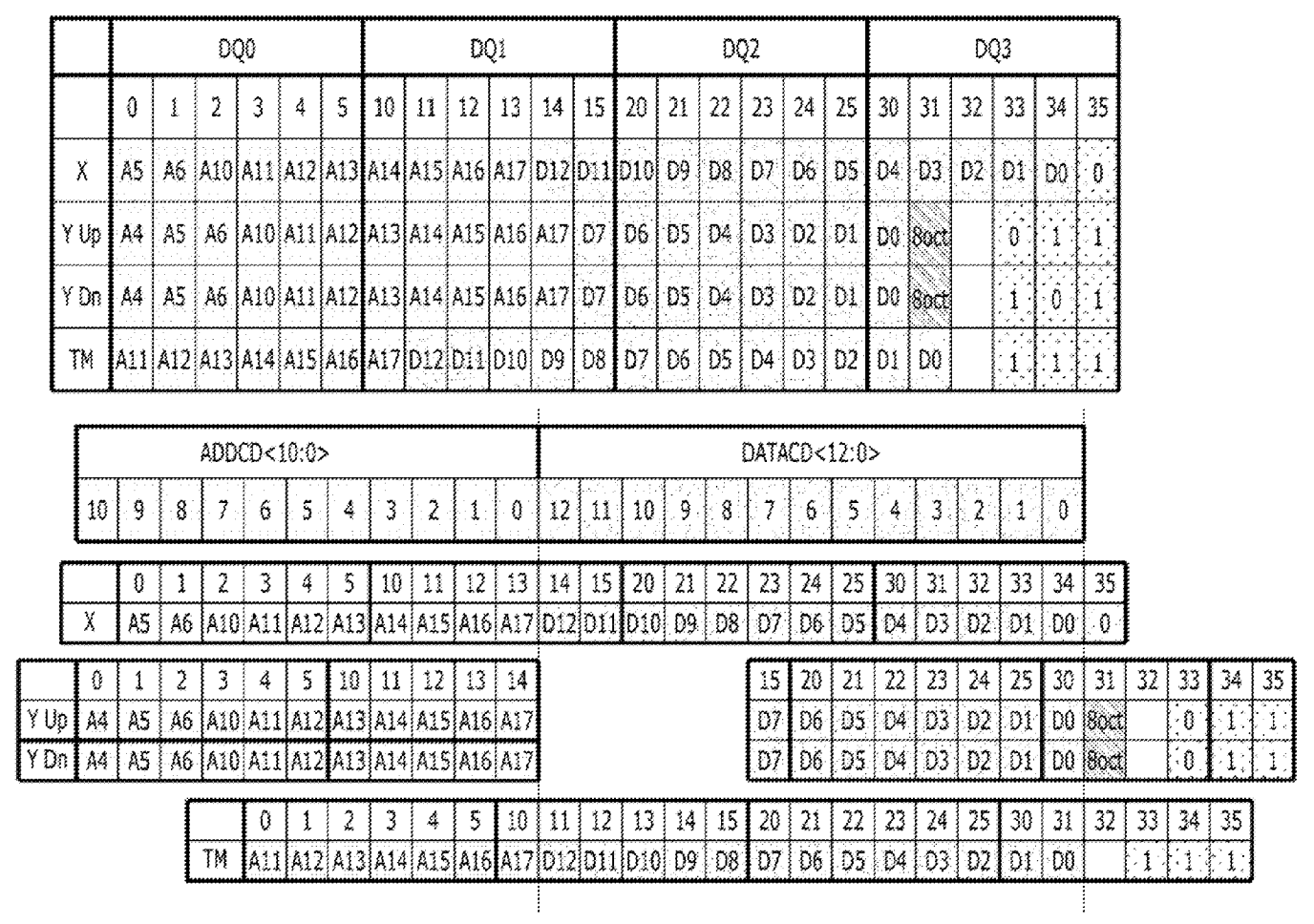

FIG. 4 illustrates an operation of the code alignment block 300 shown in FIG. 3.

FIG. 4 shows the relationship between the repair code MRD<0:5>, MRD<10:15>, MRD<20:25> and MRD<30:35> having a variable length of consecutive data, and the address code ADDCD<0:10> and the data code DATACD<0:12>.

To be specific, a $35^{th}$ bit or $33^{rd}$ to $35^{th}$ bits MRD<33:35> among the repair code MRD<0:5>, MRD<10:15>, MRD<20:25> and MRD<30:35> may be classified as the selection code MRD<35> or MRD<33:35>. The $33^{rd}$ bit and a $34^{th}$ bit MRD<33:34> may be included in the selection code MRD<35> or MRD<33:35> based on the value of the $35^{th}$ bit MRD<35>. When the value of the $35^{th}$ bit MRD<35> is set to the $33^{rd}$ and $34^{th}$ bits MRD<33:34> may be included in the information code MRD<0:5>, MRD<10:15>, MRD<20:25> and MRD<30:34> or MRD<30:32>. However, when the value of the bit MRD<35> is set to '1', the $33^{rd}$ and $34^{th}$ bits MRD<33:34> may be included in the selection code MRD<35> or MRD<33:35>.

The bit-arranged address code ADDCD<0:10> from the repair code MRD<0:5>, MRD<10:15>, MRD<20:25> and MRD<30:35> may be $0^{th}$ to $5^{th}$ bits MRD<0:5> and $10^{th}$ to $13^{th}$ bits MRD<10:13>, and the $0^{th}$ to $5^{th}$ bits MRD<0:5> and $10^{th}$ to $14^{th}$ bits MRD<10:14>, and the $0^{th}$ to $5^{th}$ bits MRD<0:5> and the $10^{th}$ bit MRD<10>, each of which is corresponding to the selected one among the fuse array 310 to 340.

The bit-arranged data code DATACD<0:12> from the repair code MRD<0:5>, MRD<10:15>, MRD<20:25> and MRD<30:35> may be $14^{th}$ and $15^{th}$ bits MRD<14:15>, $20^{th}$ to $25^{th}$ bits MRD<20:25> and $30^{th}$ to $34^{th}$ bits MRD<30:34>, and the $15^{th}$ bit MRD<15>, the $20^{th}$ to $25^{th}$ bits MRD<20:25> and the $30^{th}$ bit MRD<30> and a $11^{th}$ bit to the $15^{th}$ bit MRD<11:15> the 20$^{th}$ to 25$^{th}$ bits MRD<20:25> and the 30$^{th}$ bit and a 31$^{st}$ bit MRD<30:31>, each of which is corresponding to the selected one among the fuse array 310 to 340.

To sum up, the code alignment block 300 may arrange the information code MRD<0:5>, MRD<10:15>, MRD<20:25> and MRD<30:34> or MRD<30:32> as the address code ADDCD<0:10> and the data code DATACD<0:12> for selecting the fuses included in the selected one among the fuse arrays 310 to 340.

Herein, the 31$^{st}$ and 32$^{nd}$ bits MRD<31:32> of the repair code MRD<0:5>, MRD<10:15>, MRD<20:25> and MRD<30:35> may sometimes have 2 bits reserved for the second to fourth fuse arrays 320 to 340.

Meanwhile, the data totaling 11 bits of the bit-arranged address code ADDCD<0:10> may have predetermined bit arrangement for each of the fuse arrays 310 to 340.

For example, as shown in the drawing, the address code ADDCD<0:9> for the first fuse array 310 for storing information in relation to the row address X ADDRESS may have the upper 10 bits MRD<0:5> and MRD<10:13> of the repair code MRD<0:5>, MRD<10:15>, MRD<20:25> and MRD<30:35> having variable length of consecutive data.

The address code ADDCD<0:6> is used for the fourth fuse array 340 for storing information in relation to the test mode operation TEST MODE may have the upper 7 bits MRD<0:5> and MRD<10> of the repair code MRD<0:5>, MRD<10:15>, MRD<20:25> and MRD<30:35> having variable length of consecutive data.

The address code ADDCD<0:10> for each of the second and third fuse arrays 320 and 330 for storing information in relation to the column addresses Yup ADDRESS and Ydn ADDRESS may have the upper 11 bits MRD<0:5> and MRD<10:14> of the repair code MRD<0:5>, MRD<10:15>, MRD<20:25> and MRD<30:35> having a variable length of consecutive data.

Similarly, the data total of 13 bits of the data code DATACD<0:12> may have the predetermined bit arrangement for each of the fuse arrays 310 to 340.

For example, as shown in the drawing, the bit-arranged data code DATACD<0:12> may have all of 13 bits of data. In the case of the first fuse array 310, the bit-arranged address code ADDCD<0:10> already takes the upper 10 bits MRD<0:5> and MRD<10:13> of the repair code MRD<0:5>, MRD<10:15>, MRD<20:25> and MRD<30:35> has a variable length of consecutive data. Therefore, the 13 bits MRD<14:15>, MRD<20:25> and MRD<30:34> including the upper 11$^{th}$ bit MRD<14> may be sequentially arranged to form the bit-arranged data code DATACD<0:12> in case of the first fuse array 310. Since the 35$^{th}$ bit MRD<35> has the value of '0', the 33$^{rd}$ and 34$^{th}$ bits MRD<33:34> may be arranged to form the bit-arranged data code DATACD<0:12>.

The bit-arranged data code DATACD<0:12> for the fourth fuse array 340 for storing information in relation to the test mode operation TEST MODE may have all of 13 bits of data. In case of the fourth fuse array 340, the bit-arranged address code ADDCD<0:10> already takes the upper 7 bits MRD<0:5> and MRD<10> of the repair code MRD<0:5>, MRD<10:15>, MRD<20:25> and MRD<30:35> having a variable length of consecutive data. Therefore, the 13 bits MRD<11:15>, MRD<20:25> and MRD<30:31> including the upper 8$^{th}$ bit MRD<11> may be sequentially arranged to form the bit-arranged data code DATACD<0:12> in the case of the fourth fuse array 340. Since the 35$^{th}$ bit MRD<35> has the value of '1', the 33 and 34$^{th}$ bits MRD<33:34> may be arranged to form the selection code MRD<35> or MRD<33:35>.

The bit-arranged data code DATACD<0:12> for each of the second and third fuse arrays 320 and 330 for storing information in relation to the column addresses Yup ADDRESS and Ydn ADDRESS may have 8 bits of data. In the case of the second and third fuse arrays 320 and 330, the bit-arranged address code ADDCD<0:10> already takes the upper 11 bits MRD<0:5> and MRD<10:14> of the repair code MRD<0:5>, MRD<10:15>, MRD<20:25> and MRD<30:35> having a variable length of consecutive data. Therefore, 8 bits MRD<15>, MRD<20:25> and MRD<30> including the upper 12$^{th}$ bit MRD<15> may be sequentially arranged to form the bit-arranged data code DATACD<0:7> in the case of the second and third fuse arrays 320 and 330. Since the 35$^{th}$ bit MRD<35> has the value of '1', the 33$^{rd}$ and 34$^{th}$ bits MRD<33:34> may be arranged to form the selection code MRD<35> or MRD<33:35>.

As described above, the 11 bits which are secured as the address code ADDCD<0:10> are all required just in the second and third fuse arrays 320 and 330, and they are not all required in the first and fourth fuse arrays 310 and 340. Similarly, the 13 bits which are secured as the data code DATACD<0:12> are all required just in the first and fourth fuse arrays 310 and 340, and they are not all required in the second and third fuse arrays 320 and 330.

In the second embodiment of the present invention, the bit-arranged address code ADDCD<0:10> and the bit-arranged data code DATACD<0:12> may vary for each of the fuse arrays 310 to 340. Therefore, the fuse arrays 310 to 340 may operate in response to the corresponding bit-arranged address code ADDCD<0:10> and the bit-arranged data code DATACD<0:12>.

To be specific, since the first fuse array 310 uses the 10-bit address code ADDCD<0:9> and the 13-bit data code DATACD<0:12>, the 24-bit information code MRD<0:5>, MRD<10:15>, MRD<20:25> and MRD<30:35> may be used. Therefore, the code alignment block 300 may arrange the information code MRD<0:5>, MRD<10:15>, MRD<20:25> and MRD<30:34> except for the 35$^{th}$ bit of the selection code MRD<35> or MRD<33:35> among the repair code MRD<0:5>, MRD<10:15>, MRD<20:25> and MRD<30:35> having a variable length of consecutive data, and transmits the bit-arranged address code ADDCD<0:9> and the bit-arranged data code DATACD<0:12> to the operation block 360 corresponding to the first fuse array 310.

Since the second and third fuse arrays 320 and 330 use the 11-bit address code ADDCD<0:10> and the 8-bit data code DATACD<0:7> the 19-bit information code MRD<0:5>, MRD<10:15>, MRD<20:25> and MRD<30> may be used. Therefore, the code alignment block 300 may arrange the information code MRD<0:5>, MRD<10:15>, MRD<20:25> and MRD<30> except for the 33$^{rd}$ to 35$^{th}$ bits for the selection code MRD<35> or MRD<33:35> and the reserved 31$^{st}$ and 32$^{nd}$ bits MRD<31:32> among the repair code MRD<0:5>, MRD<10:15>, MRD<20:25> and MRD<30:35> having a variable length of consecutive data, and transmit the bit-arranged address code ADDCD<0:10> and the bit-arranged data code DATACD<0:7> to the operation blocks 360 corresponding to the second and third fuse array 320 and 330.

Since the fourth fuse array 340 uses the 7-bit address code ADDCD<0:6> and the 13-bit data code DATACD<0:12>, the 20-bit information code MRD<0:5>, MRD<10:15>, MRD<20:25> and MRD<30:31> may be used. Therefore, the code alignment block 300 may arrange the information code MRD<0:5>, MRD<10:15>, MRD<20:25> and MRD<30:31> except for the 33' to 35$^{th}$ bits MRD<33:35> for the selection code MRD<35> or MRD<33:35> and the reserved 32$^{nd}$ bit MRD<32> among the repair code MRD<0:

5>, MRD<10:15>, MRD<20:25> and MRD<30:35> having a variable length of consecutive data, and transmit the bit-arranged address code ADDCD<0:6> and the bit-arranged data code DATACD<0:12> to the operation block 360 corresponding to the fourth fuse array 340.

In accordance with the second embodiment as described above, the code alignment block 300 may arrange the information code MRD<0:5>, MRD<10:15>, MRD<20:25> and MRD<30:34> or MRD<30:32> as the bit-arranged address code ADDCD<0:10> and the bit-arranged data code DATACD<0:12> for selecting the fuses included in the selected one among the fuse arrays 310 to 340. Therefore, when the repair code MRD<0:5>, MRD<10:15>, MRD<20:25> and MRD<30:35> having a variable length of consecutive data is applied from the exterior, it means that the dispositions of the bits do not need to be aligned in advance, and the repair code MRD<0:5>, MRD<10:15>, MRD<20:25> and MRD<30:35> having the number of bits precisely required may be transmitted. In other words, when the second embodiment is compared with the first embodiment of the present invention, the total number of the bits of the repair code MRD<0:7>, MRD<10:15>, MRD<20:25> and MRD<30:35> having fixed data arrangement of the first embodiment is larger than the total number of the bits of the repair code MRD<0:5>, MRD<10:15>, MRD<20:25> and MRD<30:35> having a variable length of consecutive data of the second embodiment although the number of the address code ADDCD<0:11>/ADDCD<0:10> and the number of the data code DATACD<0:12>/DATACD<0:12>, which is used for each of the fuse arrays 310 to 340 in the actual condition, are the same.

In accordance with the second embodiment of the present invention, since the total number of bits of the repair code MRD<0:5>, MRD<10:15>, MRD<20:25> and MRD<30:35> having a variable length of consecutive data is relatively small, the repair code MRD<0:5>, MRD<10:15>, MRD<20:25> and MRD<30:35> may be inputted in parallel by 6 bits through the first to fourth pads DQ0 to DQ3, differently from the first embodiment. In other words the repair code MRD<0:5> of first 6 bits may be inputted in series through the first pad MN, and the repair code MRD<10:15> of second 6 bits may be inputted in series through the second pad DQ1, and the repair code MRD<20:25> of third 6 bits may be inputted in series through the third pad DQ2, and the repair code MRD<30:35> of fourth 6 bits may be inputted in series through the fourth pad DQ3.

Therefore, the repair code MRD<0:5>, MRD<10:15>, MRD<20:25> and MRD<30:35> may be applied at a relatively rapid speed in the semiconductor device in accordance with the second embodiment of the present invention.

In accordance with the second embodiment of the present invention as described above, when the control code MRD<0:5>, MRD<10:15>, MRD<20:25> and MRD<30:35> capable of controlling an operation of each of the fuse arrays 310 to 340 having different sizes is transmitted, the control code MRD<0:5>, MRD<10:15>, MRD<20:25> and MRD<30:35> having a variable length of consecutive data without null data may be arranged to form the bit arranged address code ADDCD<0:9> and the bit-arranged data code DATACD<0:12> for the selected one among the fuse arrays 310 to 340. In this instance, it is possible to transmit the control code MRD<0:5>, MRD<10:15>, MRD<20:25> and MRD<30:35> capable of controlling an operation of each of the fuse arrays 310 to 340 having different sizes through one protocol, and to minimize the length of the control code MRD<0:5>, MRD<10:15>, MRD<20:25> and MRD<30:35>. Consequently, it is possible to minimize the test time required for operating each of the fuse arrays 310 to 340.

Figure 5:
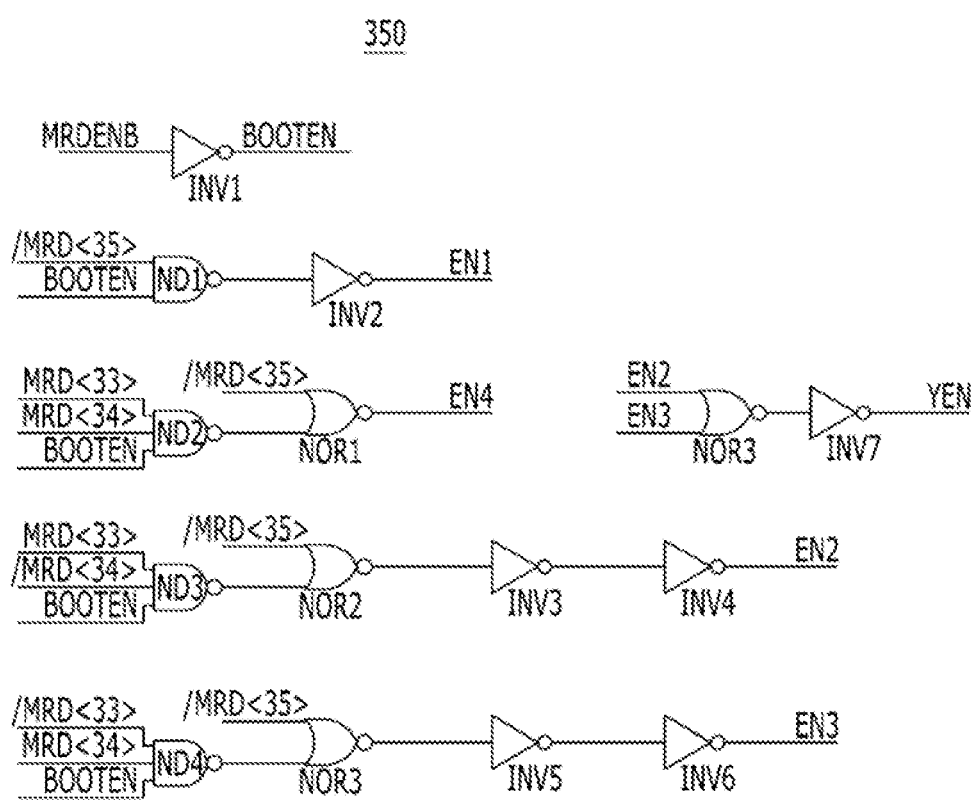
FIG. 5 illustrates a selection block shown in FIG. 3.

FIG. 5 illustrates the selection block 350 shown in FIG. 3.

Referring to FIG. 5, the circuit configuration of the selection block 350 of the semiconductor device in accordance with the second embodiment of the present invention is described in detail.

The selection block 350 may operate in response to enabling of a repair enable signal BOOTEN for enabling a repair operation on the fuse arrays 310 to 340.

The array selection signal EN1 for enabling the first fuse array 310 may be enabled, and the array selection signals EN2, EN3 and EN4 for enabling the second to fourth fuse arrays 320, 330 and 340 may be disabled in response to the value '0' of the $35^{th}$ bit MRD<35> of the repair code MRD<0:5 MRD<10:15 MRD<20:25> and MRD<30:35>.

The array selection signal EN1 for enabling the first fuse array 310 may be disabled in response to the value '1' of the $35^{th}$ bit. MRD<35> of the repair code MRD<0:5>, MRD<10:15>, MRD<20:25> and MRD<30:35>, and whether to enable the array selection signals EN2, EN3 and EN4 for enabling the second to fourth fuse arrays 320, 330 and 340 in response to the values of the $33^{rd}$ and $34^{th}$ bits MRD<33:34> may be determined.

The array selection signal EN4 for enabling the fourth fuse array 340 may be enabled, and the array selection signals EN1, EN2 and EN3 for enabling the first to third fuse arrays 310, 320 and 330 may be disabled, in response to the value '1' of the $35^{th}$ bit MRD<35> and the value '1' of the $33^{rd}$ and $34^{th}$ bits MRD<33:34> of the repair code MRD<0:5>, MRD<10:15>, MRD<20:25> and MRD<30:35>.

The array selection signal EN2 for enabling the second fuse array 320 may be enabled, and the array selection signals EN1, EN3 and EN4 for enabling the first fuse array 310 and the third and fourth fuse arrays 330 and 340 may be disabled, in response to the value '1' of the $35^{th}$ bit MRD<35>, the value '1' of the $33^{rd}$ bit MRD<33> and the value '0' of the $34^{th}$ bit MRD<34> of the repair code MRD<0:5>, MRD<10:15>, MRD<20:25> and MRD<30:35>.

The array selection signal EN3 for enabling the third fuse array 330 may be enabled, and the array selection signals EN1, EN2 and EN4 for enabling the first and second fuse arrays 310 and 320 and the fourth fuser array 340 may be disabled, in response to the value '1' of the $35^{th}$ bit MRD<35>, the value '0' of the $33^{rd}$ bit MRD<33> and the value '1' of the $34^{th}$ bit MRD<34> of the repair code MRD<0:5>, MRD<10:15>, MRD<20:25> and MRD<30:35>.

The second and third fuse arrays 320 and 330 may include information in relation to a column address Y ADDRESS, and they may correspond to a single enable signal since the number of the fuses included inside the two arrays is the same. Therefore, a column enable signal YEN, which is enabled in response to enabling of one signal among the array selection signal EN2 for enabling the second fuse array 320 and the array selection signal EN3 for enabling the third fuse array 330, is generated.

The selection block 350 may include a first NAND gate ND1 and an inverter INV2, which performs an AND operation on an inverted value /MRD<35> of the $35^{th}$ bit MRD<35> of the repair code MRD<0:5>, MRD<10:15>, MRD<20:25> and MRD<30:35>, and the repair enable signal BOOTEN and outputs the array selection signal EN1 for enabling the first fuse array 310.

The selection block 350 may include a second NAND gate ND2, which performs a NAND operation on the $33^{rd}$ bit MRD<33> and the $34^{th}$ bit MRD<34> of the repair code MRD<0:5>, MRD<10:15>, MRD<20:25> and MRD<30:

35> and the repair enable signal BOOTEN, and a NOR gate NOR1, which performs a NOR operation on an output signal of the second NAND gate ND2 and the inverted value /MRD<35> of the 35$^{th}$ bit MRD<35> and outputs the array selection signal EN4 for enabling the fourth fuse array 340.

The selection block 350 may include a third NAND gate ND3, which performs a NAND operation on the 33 bit MRD<33> an inverted value /MRD<34> of the 34$^{th}$ bit MRD<34> of the repair code MRD<0:5>, MRD<10:15>, MRD<20:25> and MRD<30:35> and the repair enable signal BOOTEN, and a NOR gate NOR2 and inverters INV3 and INV4, which perform a NOR operation on an output signal of the third NAND gate ND3 and the inverted value /MRD<35> of the 35$^{th}$ bit MRD<35> and output the array selection signal' EN2 for enabling the second fuse array 320.

The selection block 350 may include a fourth NAND gate ND4, which performs a NAND operation on an inverted value /MRD<33> of the 33$^{rd}$ bit MRD<33> the 34$^{th}$ bit MRD<34> of the repair code MRD<0:5>, MRD<10:15>, MRD<20:25> and MRD<30:35> and the repair enable signal BOOTEN, and a NOR gate NOR3 and inverters INV5 and INV6, which perform a NOR operation on an output signal of the fourth NAND gate ND4 and the inverted value /MRD<35> of the 35$^{th}$ bit MRD<35> and output the array selection signal EN3 for enabling the third fuse array 330.

The selection block 350 may include a NOR gate NOR4 and an inverter INV7, which perform an OR operation on the array selection signal EN2 for enabling the second fuse array 320 and the array selection signal EN3 for enabling the third fuse array 330 and output the column enable signal YEN.

Figure 6:
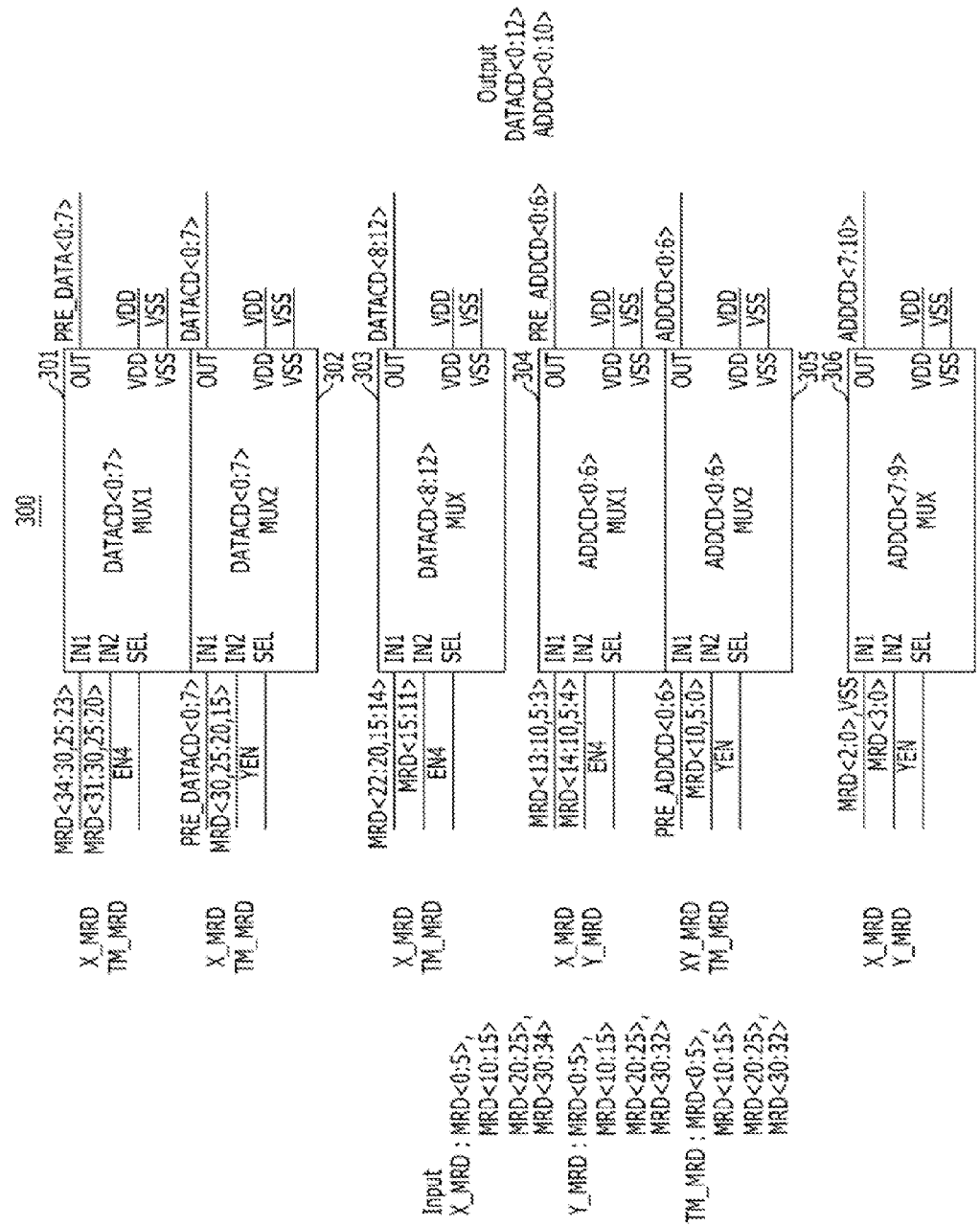
FIG. 6 illustrates a code alignment block shown in FIG. 3.

FIG. 6 illustrates the code alignment block 300 shown in FIG. 3.

Referring to FIG. 6, the circuit configuration of the code alignment block 300 of the semiconductor device in accordance with the second embodiment of the present invention is described in detail. The code alignment block 300 may include first to sixth MUX 301 to 306.

To be specific, the code alignment block 300 may arrange the information code MRD<0:5>, MRD<10:15>, MRD<20:25> and MRD<30:34> or MRD<30:32> except for the selection code MRD<35> or MRD<33:35> of the repair code MRD<0:5>, MRD<10:15>, MRD<20:25> and MRD<30:35> having a variable length of consecutive data to form the bit-arranged address code ADDCD<0:10> and the bit-arranged data code DATACD<0:12> for the selected one among the fuse arrays 310 to 340, which is selected by the selection block 350 through the array selection signals EN1 to EN4. The arrangement of the code alignment block 300 may be controlled by the array selection signals E1 to E4, and the column enable signal YEN.

Among the repair code MRD<0:5>, MRD<10:15>, MRD<20:25> and MRD<30:35> having a variable length of consecutive data the code alignment block 300 may select 23 bits of data for the bit-arranged address code ADDCD<0:9> and the bit-arranged data code DATACD<0:12> for the first fuse array 310 including the other 0$^{th}$ to 5$^{th}$ bits MRD<0:5>, 10$^{th}$ to 15$^{th}$ bits MRD<10:15>, 20$^{th}$ to 25$^{th}$ bits MRD<20:25> and 30$^{th}$ to 34$^{th}$ bits MRD<30:34> except for the 35$^{th}$ bit of the selection code MRD<35> which is represented as 'X_MRD' in the drawing.

Among the repair code MRD<0:5>, MRD<10:15>, MRD<20:25> and MRD<30:35> having a variable length of consecutive data, the code alignment block 300 may select 20 bits of data for the bit-arranged address code ADDCD<0:10>, the bit-arranged data code DATACD<0:7>, and the reserved 2 bits for each of the second and third fuse arrays 320 and 330 including the other 0$^{th}$ to 5$^{th}$ bits MRD<0:5>, 10$^{th}$ to 15$^{th}$ bits MRD<10:15>, 20$^{th}$ to 25$^{th}$ bits MRD<20:25> and 30$^{th}$ to 32$^{nd}$ bits MRD<30:32> except for the 33$^{rd}$ to 35$^{th}$ bit of the selection code MRD<33:35>, which is represented as 'Y_MRD' in the drawing.

Among the repair code MRD<0:5>, MRD<10:15>, MRD<20:25> and MRD<30:35> having a variable length of consecutive data, the code alignment block 300 may select 21 bits of data for the bit-arranged address code ADDCD<0:5>, the bit-arranged data code DATACD<0:12> and the reserved 1 bit for the fourth fuse array 340 including the other 0$^{th}$ to 5$^{th}$ bits MRD<0:5>, 10$^{th}$ to 15$^{th}$ bits MRD<10:15>, 20$^{th}$ to 25$^{th}$ bits MRD<20:25> and 30$^{th}$ to 32$^{nd}$ bits MRD<30:32> except for the 33$^{rd}$ to 35$^{th}$ bit of the selection code MRD<33:35>, which is represented as 'TM_MRD' in the drawing.

The 13-bit data code DATACD<0:12> and the 11-bit address code ADDCD<0:10> may be outputted from the code alignment block 300.

The data code DATACD<0:7> of the upper 8 bits among the 13-bit data code DATACD<0:12> may be arranged based on the operations of the first and second multiplexers 301 and 302.

The first multiplexer 301 may select one code among the 8-bit repair code MRD<23:25> and MRD<30:34> corresponding to the first fuse array 310, which is inputted through a first input terminal IN1, and the 8-bit repair code MRD<20:25> and MRD<30:31> corresponding to the fourth fuse array 340, which is inputted through a second input terminal IN2, in response to the array selection signal EN4, which is inputted through a selection node SEL for enabling the fourth fuse array 340, and may output as the bit-arranged data code PRE_DATACD<0:7> of the upper 8 bits.

The second multiplexer 302 may select one code among the bit-arranged data code PRE_DATACD<0:7>, which is outputted from the first multiplexer 301 and inputted through the first input terminal IN1, and the 8-bit repair code MRD<15>, MRD<20:25> and MRD<30> corresponding to the second or third fuse array 320 or 330, which is inputted through the second input terminal IN2, in response to the column enable signal YEN, which is inputted through the selection node SEL, and may output as the bit-arranged data code DATACD<0:7> of the upper 8 bits.

The data code DATACD<8:12> of the lower 5 bits among the 13-bit data code DATACD<0:12> may be arranged based on the operation of the third multiplexer 303.

The third multiplexer 303 may select one code among the 5-bit repair code MRD<20:22> and MRD<14:15> corresponding to the first fuse array 310, which is inputted through the first input terminal IN1, and the 5-bit repair code MRD<11:15> corresponding to the fourth fuse array 340, which is inputted through the second input terminal IN2, in response to the array selection signal EN4, which is inputted through the selection node SEL for enabling the fourth fuse array 340, and may output as the bit-arranged data code DATACD<8:12> of the lower 5 bits.

The address code ADDCD<0:6> of the upper 7 bits among the 11-bit address code ADDCD<0:10> is aligned based on the operations of the fourth and fifth multiplexers 304 and 305.

The fourth multiplexer 304 may select one code among the 7-bit repair code MRD<3:5> and MRD<10:13> corresponding to the first fuse array 310, which is inputted through the first input terminal IN1, and the 7-bit repair code MRD<4:5> and MRD<10:14> corresponding to the second or third fuse array 320 or 330, which is inputted through the second input terminal 1N2, in response to the array selection signal EN4, which is inputted through the selection node SEL for enabling the fourth fuse array 340, and may output as the bit-arranged address code PRE_ADDCD<0:6> of the upper 7 bits.

The fifth multiplexer 305 may select one code among the bit-arranged address code PRE_ADDCD<0:6>, which is outputted from the fourth multiplexer 304 and inputted through the first input terminal IN1, and the 7-bit repair code MRD<0:5> and MRD<10> corresponding to the fourth fuse array 340, which is inputted through the second input terminal IN2, in response to the signal YEN, which is inputted through the selection node SEL, and may output as the bit-arranged address code ADDCD<0:6> of the upper 7 bits.

The address code ADDCD<7:10> of the lower 4 bits among the 11-bit address code ADDCD<0:1> is aligned based on the operation of the sixth multiplexer 306.

The sixth multiplexer 306 may select one code among the 3-bit repair code MRD<0:2> and a ground voltage VSS corresponding to the first fuse array 310, which are inputted through the first input terminal IN1, and the 4-bit repair code MRD<0:3> corresponding to the second or third fuse array 320 or 330, which is inputted through the second input terminal IN2, in response to the column enable signal YEN, which is inputted through the selection node SEL, and may output as the bit-arranged address code ADDCD<7:10> of the lower 4 bits.

Figure 10:
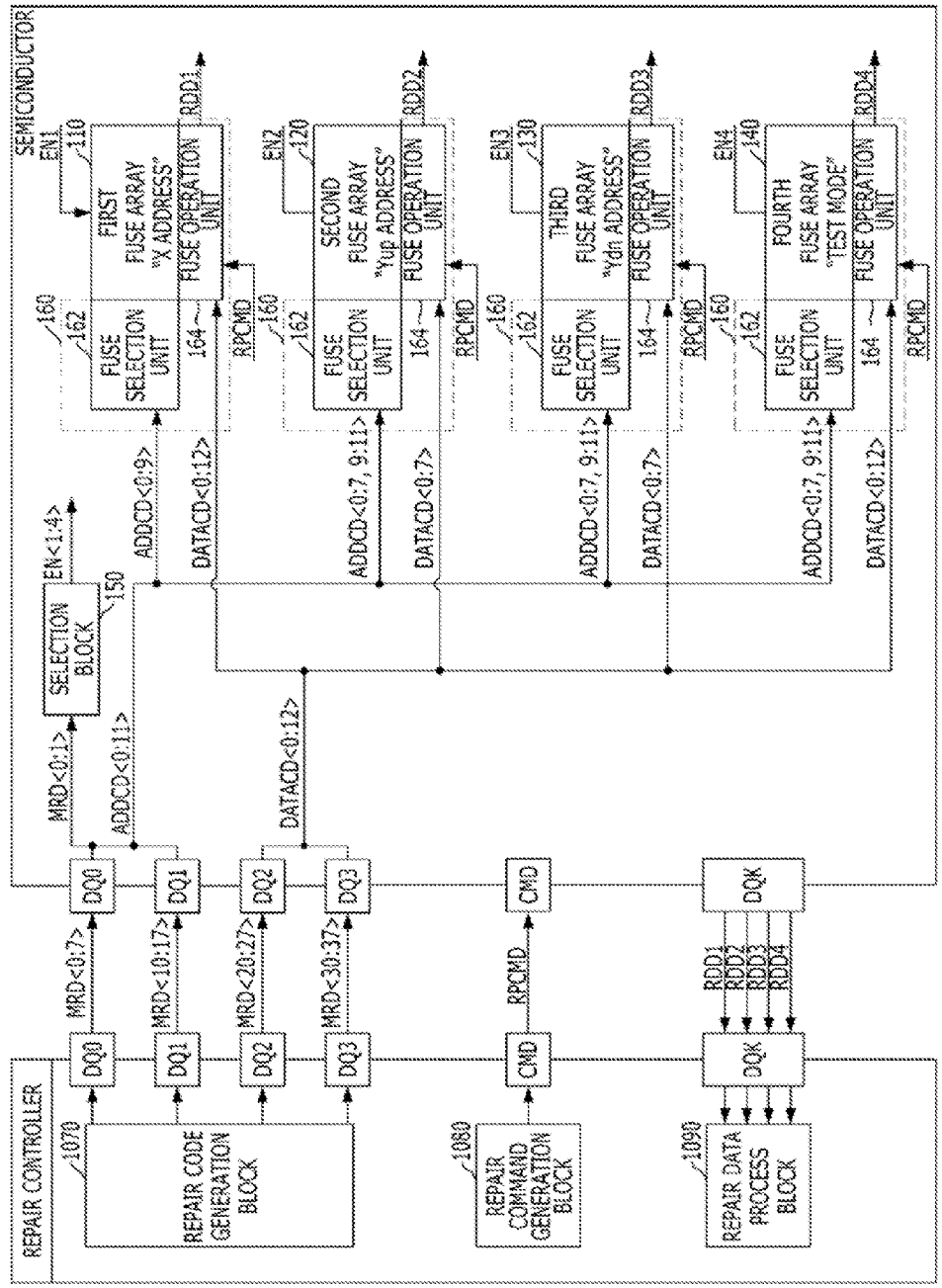
FIG. 10 illustrates a semiconductor system including the semiconductor device shown in FIG. 1.

FIG. 10 illustrates a semiconductor system including the semiconductor device shown in FIG. 1.

FIG. 10 shows the structure of the semiconductor system including the semiconductor device in accordance with the first embodiment of the present invention shown in FIG. 1.

A repair controller included in the semiconductor system may generate the repair command RPCMD and the repair code MRD<0:7>, MRD<10:17>, MRD<20:27> and MRD<30:37> having a fixed data arrangement, and may transmit the same to the semiconductor device. In other words, the repair command RPCMD may be generated from a repair command generation block 1080 included in the repair controller, and transmitted to the semiconductor device, and the repair code MRD<0:7>, MRD<10:17>, MRD<20:27> and MRD<30:37> having a fixed data arrangement may be generated from a repair code generation block 1070 included in the repair controller, and transmitted to the semiconductor device. A repair data process block 1090 included in the repair controller may receive the repair data RDD1, RDD2, RDD3 or RDD4, which is outputted by performing a read operation on the plurality of fuse arrays 110 to 140 in the semiconductor device, and may process the repair data repair data RDD1, RDD2, RDD3 or RDD4 in a predetermined method.

The repair code MRD<0:7>, MRD<10:17>, MRD<20:27> and MRD<30:37> may be generated with the fixed dispositions of the corresponding bits from the repair code generation block 1070, and then transmitted to the semiconductor device.

The semiconductor device may receive the repair code MRD<0:7>, MRD<10:17>, MRD<20:27> and MRD<30:37> having fixed data arrangement through predetermined first pads DQ0, DQ1, DQ2 and DQ3 and the repair command RPCMD through a predetermined second pad CMD to control an operation of each of the fuse arrays 110 to 140.

The semiconductor device in accordance with the first embodiment of the present invention as described in FIGS. 1 and 2 may control the operation of each of the fuse arrays 110 to 140 in common by receiving the repair code MRD<0:7>, MRD<10:17>, MRD<20:27> and MRD<30:37> of which the bit dispositions are fixed.

The structure of the semiconductor device shown in FIG. 10 is the same as the structure of the semiconductor device in accordance with the first embodiment of the present invention shown in FIG. 1. Therefore, a detailed description thereon is omitted.

Figure 11:
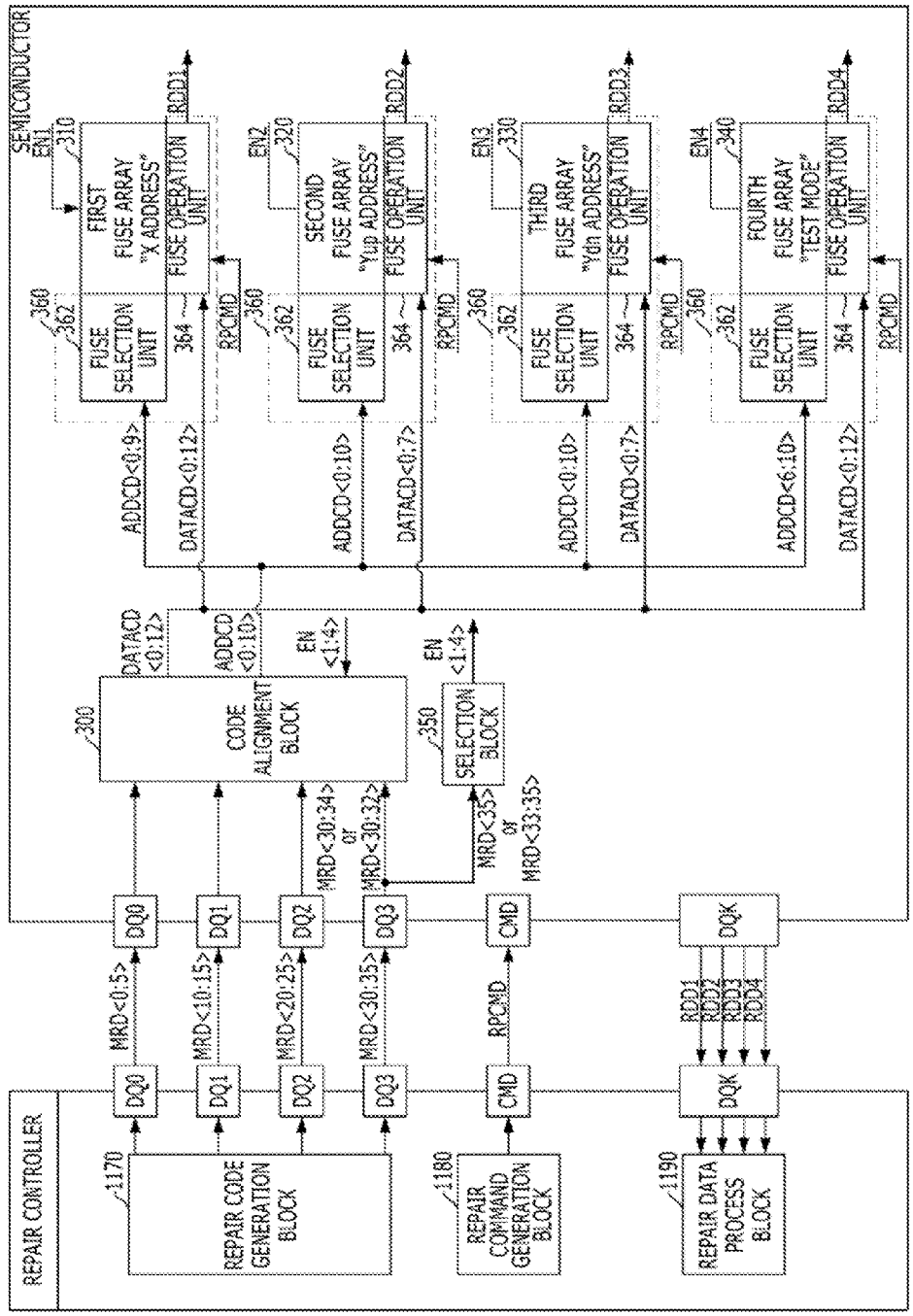
FIG. 11 illustrates a semiconductor system including the semiconductor device shown in FIG. 3.

FIG. 11 illustrates a semiconductor system including the semiconductor device shown in FIG. 3.

FIG. 11 shows the structure of the semiconductor system including the semiconductor device in accordance with the second embodiment of the present invention shown in FIG. 3.

A repair controller included in the semiconductor system may generate the repair command RPCMD and the repair code MRD<0:5>, MRD<10:15>, MRD<20:25> and MRD<30:35> having a variable length of consecutive data, and may transmit the same to the semiconductor device. In other words, the repair command RPCMD may be generated from a repair command generation block 1180 included in the repair controller, and transmitted to the semiconductor device, and the repair code MRD<0:5>, MRD<10:15>, MRD<20:25> and MRD<30:35> having variable length of consecutive data may be generated from a repair code generation block 1170 included in the repair controller, and transmitted to the semiconductor device. A repair data process block 1190 included in the repair controller may receive the repair data RDD1, RDD2, RDD3 or RDD4, which is outputted by performing a read operation on the plurality of fuse arrays 310 to 340 in the semiconductor device, and may process the repair data repair data RDD1, RDD2, RDD3 or RDD4 in predetermined method.

The repair code MRD<0:5>, MRD<10:15>, MRD<20:25> and MRD<30:35>, which is generated from the repair code generation block 1170, may have a variable length of consecutive data, and then be transmitted to the semiconductor device.

The semiconductor device may receive the repair code MRD<0:5>, MRD<10:15>, MRD<20:25> and MRD<30:35> having a variable length of consecutive data through predetermined first pads DQ0, DQ1, DQ2 and DQ3 and the repair command RPCMD through a predetermined second pad CMD to control operations of each of the fuse arrays 310 to 340.

The semiconductor device in accordance with the second embodiment of the present invention as described in FIGS. 3 and 6 may control the operation of each of the fuse arrays 310 to 340 in common by receiving the repair code MRD<0:5>, MRD<10:15>, MRD<20:25> and MRD<30:35> which has a variable length of consecutive data and aligning the bit dispositions.

The structure of the semiconductor device shown in FIG. 11 is the same as the structure of the semiconductor device in accordance with the second embodiment of the present invention shown in FIG. 3. Therefore, a detailed description thereon is omitted.

In accordance with the embodiments of the present invention, the method of transmitting control code with bit dispositions that are fixed in advance may be used when the control code capable of controlling an operation of each of multiple fuse arrays having different sizes in common is transmitted. Therefore, it is possible to transmit the control code for controlling the operations of the fuse arrays having different sizes in common through one protocol.

Furthermore, when the control code capable of controlling the operation of each of the fuse arrays having different sizes in common is transmitted, the method of transmitting the control code, which has a variable length of consecutive data, may be used, but the method of arranging the control code again inside the semiconductor device for each of the fuse arrays may be used. In this instance, it is possible to transmit a control code capable of controlling the operations of each of the fuse arrays having different sizes in common through one protocol and to minimize the length of the control code. Consequently, it is possible to minimize the test time required for operating each of the fuse arrays.

While the present invention has been described with respect to the specific embodiments, it is noted that the embodiments of the present invention are not restrictive but descriptive. Further, it is noted that the present invention may be achieved in various ways through substitution, change, and modification, by those skilled in the art without departing from the scope of the present invention as defined by the following claims.

What is claimed is:

1. A semiconductor device, comprising:
a plurality of fuse arrays each including a plurality of fuses;
a selection block suitable for selecting one fuse array among the fuse arrays in response to values of a group of bits of a repair code;
a code alignment block suitable for arranging bits of the repair code other than the group of bits of the repair code, wherein the arrangement corresponds to the fuse array selected by the selection block; and
an operation block suitable for controlling an operation of the fuse array selected by the selection block in response to a repair command, and an output code of the code alignment block.

2. The semiconductor device of claim 1, wherein each of the fuse arrays includes a different number of fuses arranged in an array.

3. The semiconductor device of claim 2,
wherein the repair code includes a selection code corresponding to the group of bits of the repair code, and an information code corresponding to the bits of the repair code other than the group of the bits of the repair code, and
wherein the information code includes an address code for selecting the fuses included in the fuse array, which is selected by the selection block, and a data code, which is used for operations of the fuses selected based on the address code.

4. The semiconductor device of claim 3, wherein the selection block enables a single fuse array among the fuse arrays, and disables the other fuse arrays in response to a value of the selection code.

5. The semiconductor device of claim 3, wherein the code alignment block controls the number of bits of the address code, and the number of bits of the data code among the information code based on the fuse array, which is selected by the selection block.

6. The semiconductor device of claim wherein the operation block includes:
a fuse selection unit suitable for selecting a predetermined number of fuses among the fuses included in the fuse array, which is selected by the selection block in response to the address code; and
a fuse operation unit suitable for performing a rupture or read operation on the fuses selected by the fuse selection unit in response to the repair command.

7. The semiconductor device of claim 6, wherein the fuse operation unit programs a value of the data code in the fuses selected by the fuse selection unit during the rupture operation in response to the repair command.

8. The semiconductor device of claim 6, wherein the fuse operation unit selects a portion of fuses corresponding to the value of the data code among the fuses selected by the fuse selection unit, and outputs data stored in the fuses, which are selected by the fuse operation unit through a predetermined pad, during the read operation in response to the repair command.

9. A semiconductor repair system, comprising:
a repair controller suitable for generating a repair command and a repair code; and
a semiconductor device having a plurality of fuse arrays each including a plurality of fuses, and suitable for controlling each operation of the fuse arrays by receiving the repair code through a predetermined first pad and receiving the repair command through a predetermined second pad,
wherein the semiconductor device includes:
a selection block suitable for selecting one fuse array among the fuse arrays in response to values of a group of bits of the repair code;
a code alignment block suitable for arranging the bits of the repair code other than the group of bits of the repair code, wherein the arrangement corresponds to the fuse array selected by the selection block; and
an operation block suitable for controlling an operation of the fuse array selected by the selection block in response to the repair command, and an output code of the code alignment block.

10. The semiconductor repair system of claim 9, wherein each of the fuse arrays includes a different number of fuses arranged in an array.

11. The semiconductor repair system of claim 10,
wherein the repair code includes a selection code corresponding to the group of the bits of the repair code, and an information code corresponding to the bits of the repair code other than the group of the bits of the repair code, and
the information code includes an address code for selecting the fuses included in the fuse array which is selected by the selection block, and a data code, which is used for operations of the fuses selected based on the address code.

12. The semiconductor repair system of claim 11, wherein the selection block enables a single fuse array among the fuse arrays and disables the other fuse arrays in response to a value of the selection code.

13. The semiconductor repair system of claim 11, wherein the code alignment block controls the number of bits of the address code, and the number of bits of the data code among the information code based on the fuse array, which is selected by the selection block.

14. The semiconductor repair system of claim 11, wherein the operation block includes:
a fuse selection unit suitable for selecting a predetermined number of fuses among the fuses included in the fuse array, which is selected by the selection block in response to the address code; and
a fuse operation unit suitable for performing a rupture or read operation on the fuses selected by the fuse selection unit in response to the repair command.

15. The semiconductor repair system of claim 14, wherein the fuse operation unit programs a value of the data code in the fuses selected by the fuse selection unit during the rupture operation in response to the repair command.

16. The semiconductor repair system of claim 14, wherein the fuse operation unit selects a group of fuses corresponding to the value of the data code among the fuses selected by the fuse selection unit, and outputs data stored in the fuses, which are selected by the fuse operation unit through a predetermined third pad, during the read operation in response to the repair command.

17. A method for operating a semiconductor device including a plurality of fuse arrays each having a plurality of fuses, comprising:
- selecting one fuse array among the fuse arrays in response to values of a group of bits of a repair code;
- generating a repair alignment code by arranging the bits of the repair code other than the group of the bits of the repair code, wherein the arrangement corresponds to the fuse array selected by the selecting of the fuse array, and
- controlling an operation of the fuse array selected by the selecting of the fuse array in response to a repair command, and the repair alignment code.

18. The method of claim 17,
- wherein the repair code Includes a selection code corresponding to the group of the bits of the repair code, and an information code corresponding to the bits of the repair code other than the group of the bits of the repair code, and
- the information code includes an address code for selecting the fuses included in the fuse array selected by the selecting of the fuse array, and a data code, which is used for operations of the fuses selected based on the address code.

19. The method of claim 18, wherein the generating of the repair alignment code outputs the repair alignment code by controlling the number of bits of the address code, and the number of bits of the data code among the information code based on the fuse array selected by the selecting of the fuse array.

20. The method of claim 18, wherein the controlling of the operation of the fuse array includes:
- selecting a predetermined number of fuses among the fuses included in the fuse array, which is selected by the selecting of the fuse array in response to the address code;
- programming a value of the data code in the fuses selected by the selecting of the predetermined number of fuses during a rupture operation in response to the repair command; and
- selecting a group of fuses corresponding to the value of the data code among the fuses selected by the selecting of the predetermined number of fuses, and outputting data stored in the fuses, which are selected by the selecting of the predetermined number of fuses through a predetermined pad, during a read operation in response to the repair command.

* * * * *